United States Patent
Yang

(10) Patent No.: US 8,703,605 B2
(45) Date of Patent: *Apr. 22, 2014

(54) HIGH YIELD AND HIGH THROUGHPUT METHOD FOR THE MANUFACTURE OF INTEGRATED CIRCUIT DEVICES OF IMPROVED INTEGRITY, PERFORMANCE AND RELIABILITY

(76) Inventor: Byung Chun Yang, Cupertino, CA (US)

( * ) Notice: Subject to any disclaimer, the term of this patent is extended or adjusted under 35 U.S.C. 154(b) by 40 days.

This patent is subject to a terminal disclaimer.

(21) Appl. No.: 12/831,482

(22) Filed: Jul. 7, 2010

(65) Prior Publication Data

US 2010/0301491 A1 Dec. 2, 2010

Related U.S. Application Data

(63) Continuation-in-part of application No. 12/339,033, filed on Dec. 18, 2008.

(60) Provisional application No. 60/014,686, filed on Dec. 18, 2007.

(51) Int. Cl.
*H01L 21/4763* (2006.01)

(52) U.S. Cl.
USPC ........... 438/639; 438/633; 438/637; 438/638; 438/706; 438/710; 438/745; 438/906; 257/E21.579; 257/E21.224; 257/E21.226; 257/E21.228; 257/E21.229

(58) Field of Classification Search
USPC ......... 438/633, 637–639, 706, 710, 745, 906; 257/E21.579, E21.224, E21.226, 257/E21.228, E21.229
See application file for complete search history.

(56) References Cited

U.S. PATENT DOCUMENTS 6,635,565 B2 10/2003 Wu et al.
6,656,841 B1 12/2003 Kim
(Continued)

FOREIGN PATENT DOCUMENTS

JP 2007-294625 11/2007

OTHER PUBLICATIONS

Ghandhi, Sorab, "VLSI Fabrication Principles", 1983 by John Wiley & Sons, Inc., pp. 517-520.*

(Continued)

*Primary Examiner* — Michelle Mandala
(74) *Attorney, Agent, or Firm* — Edward C. Kwok; Hogan Lovells US LLP

(57) ABSTRACT

A method for forming a contact opening, such as a via hole, is provided. In the method, a sacrificial layer is deposited over a damascene feature prior to exposing a conductor formed in a substrate at a bottom of the opening. The sacrificial layer is provided to prevent damage or contamination of materials used. Even after the conductor has been exposed once or more times, the sacrificial layer can be deposited over the damascene feature to protect it from further damage or contamination by a subsequent process that will further expose the conductor at the contact opening bottom. The exposing step may form a recess in the conductor. By further forming a trench feature over the contact opening, a dual damascene feature can be fabricated. By performing further damascene process steps over already formed damascene interconnect features, various interconnect systems, such as a single damascene planar via, a single damascene embedded via and a dual damascene interconnect system having either a planar via or an embedded via, can be fabricated. Dual damascene interconnect structures having either a sacrificial layer incorporated in them or having no sacrificial layer incorporated in them are also provided.

61 Claims, 20 Drawing Sheets

(56) References Cited

U.S. PATENT DOCUMENTS

| | | |
|---|---|---|
| 7,049,226 B2 | 5/2006 | Chung et al. |
| 7,122,462 B2 | 10/2006 | Clevenger et al. |
| 7,651,942 B2 * | 1/2010 | Huebinger et al. ............ 438/639 |
| 8,207,060 B2 * | 6/2012 | Yang .............................. 438/633 |
| 2004/0127016 A1 * | 7/2004 | Hoog et al. ................... 438/637 |
| 2005/0112864 A1 | 5/2005 | Clevenger et al. |
| 2005/0118796 A1 | 6/2005 | Chiras et al. |
| 2005/0170642 A1 | 8/2005 | Hineman et al. |
| 2006/0019485 A1 | 1/2006 | Komai et al. |
| 2006/0246717 A1 | 11/2006 | Wang |
| 2007/0184669 A1 | 8/2007 | Huang et al. |
| 2009/0081418 A1 | 3/2009 | Allen et al. |

OTHER PUBLICATIONS

Written Opinion of the International Searching Authority, PCT/US2008/087553, mailing date Aug. 20, 2009, pp. 3.

ISR, PCT/US2008/087553, mailing date Aug. 20, 2009, pp. 2.

* cited by examiner

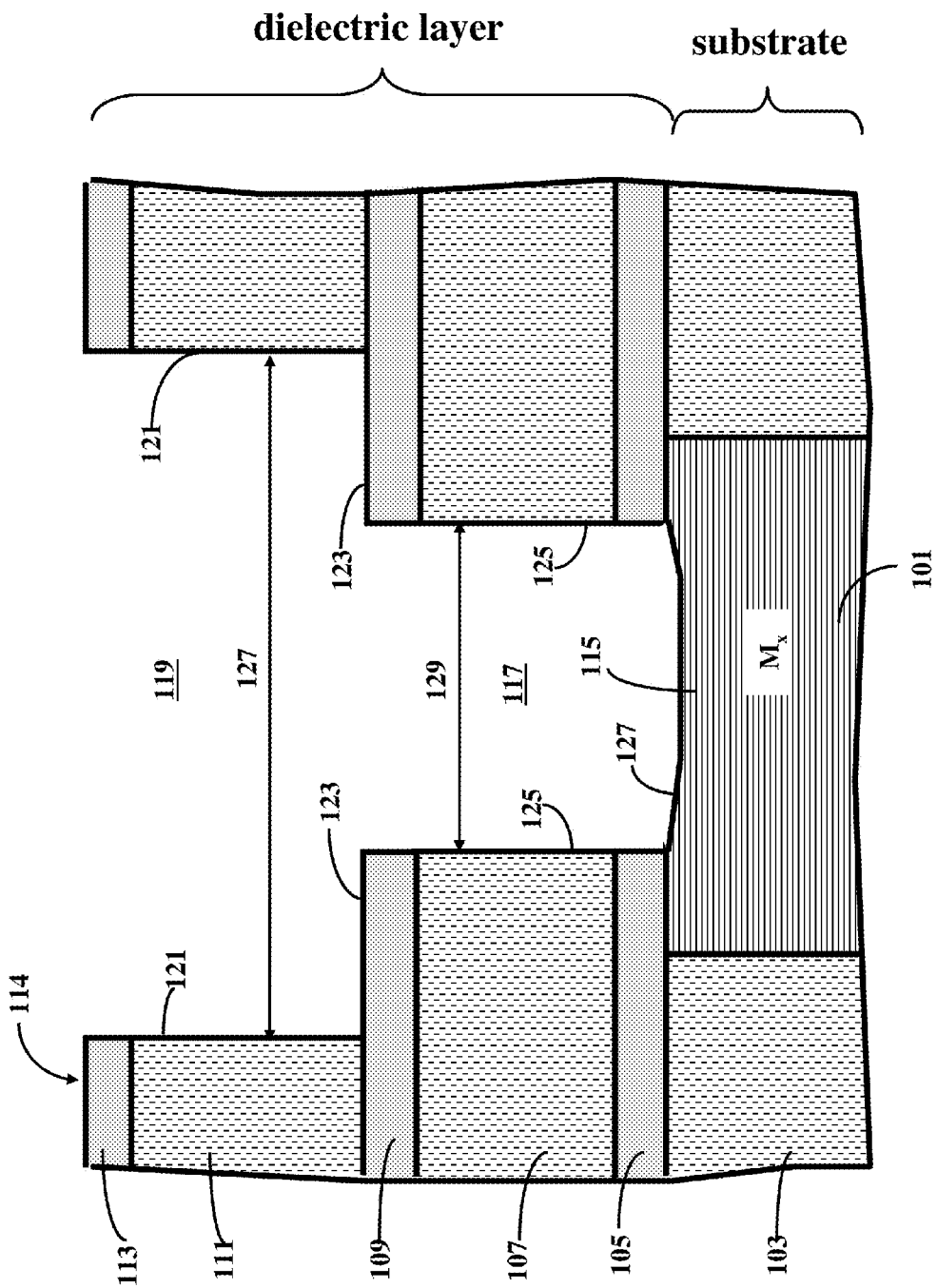

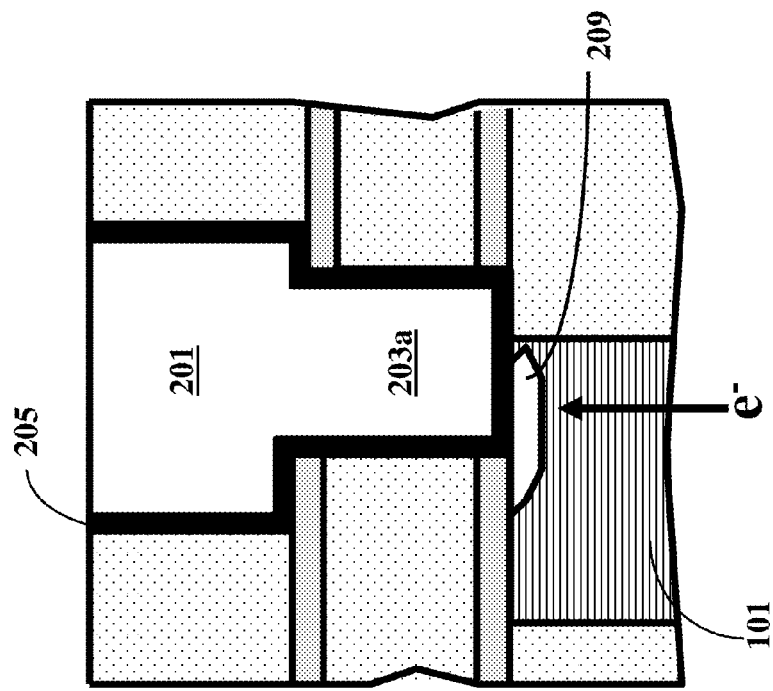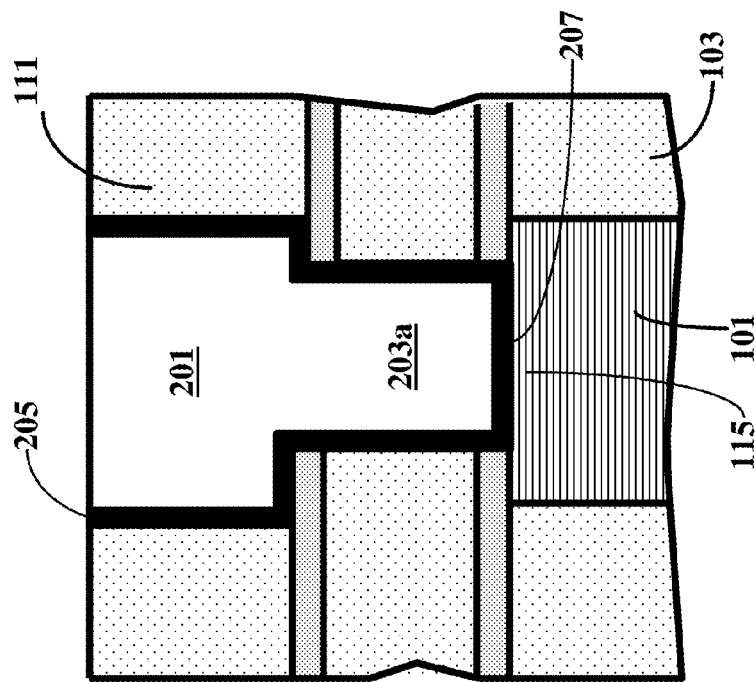

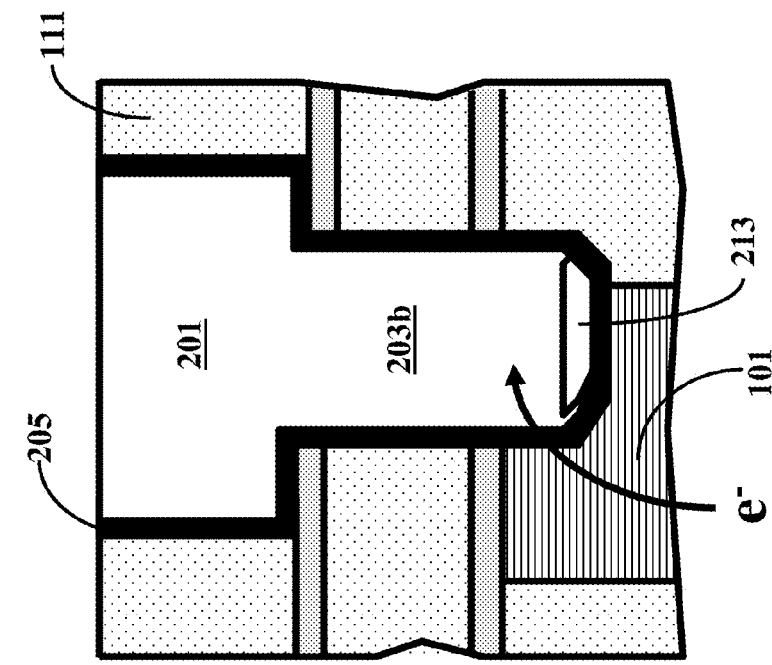
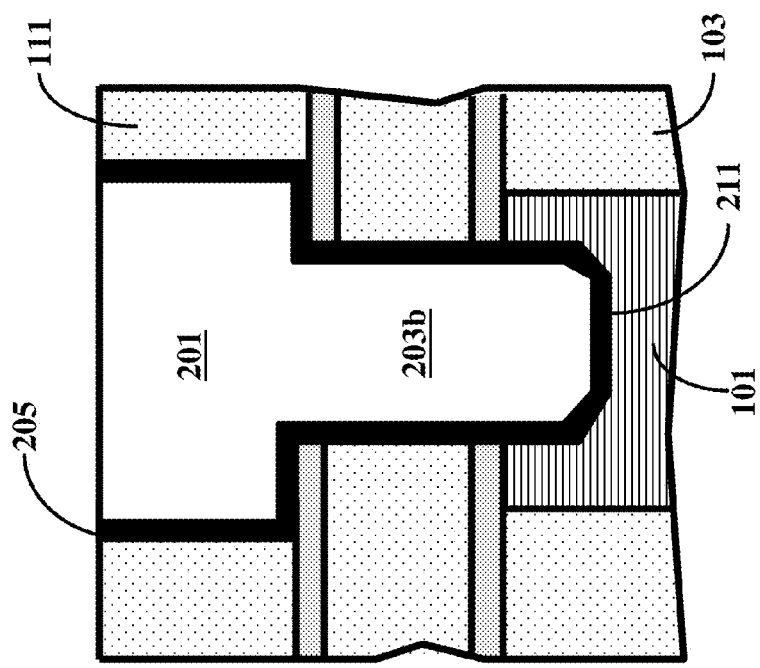

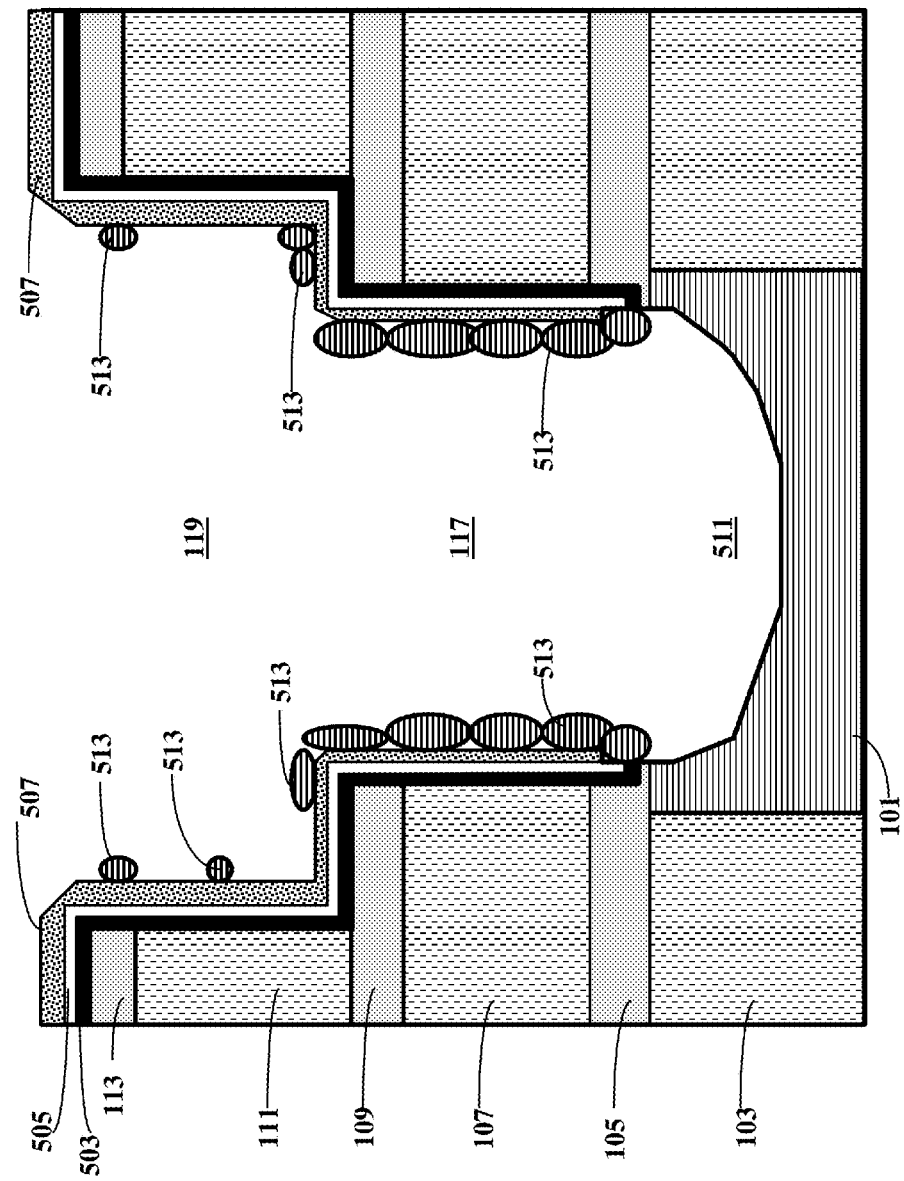

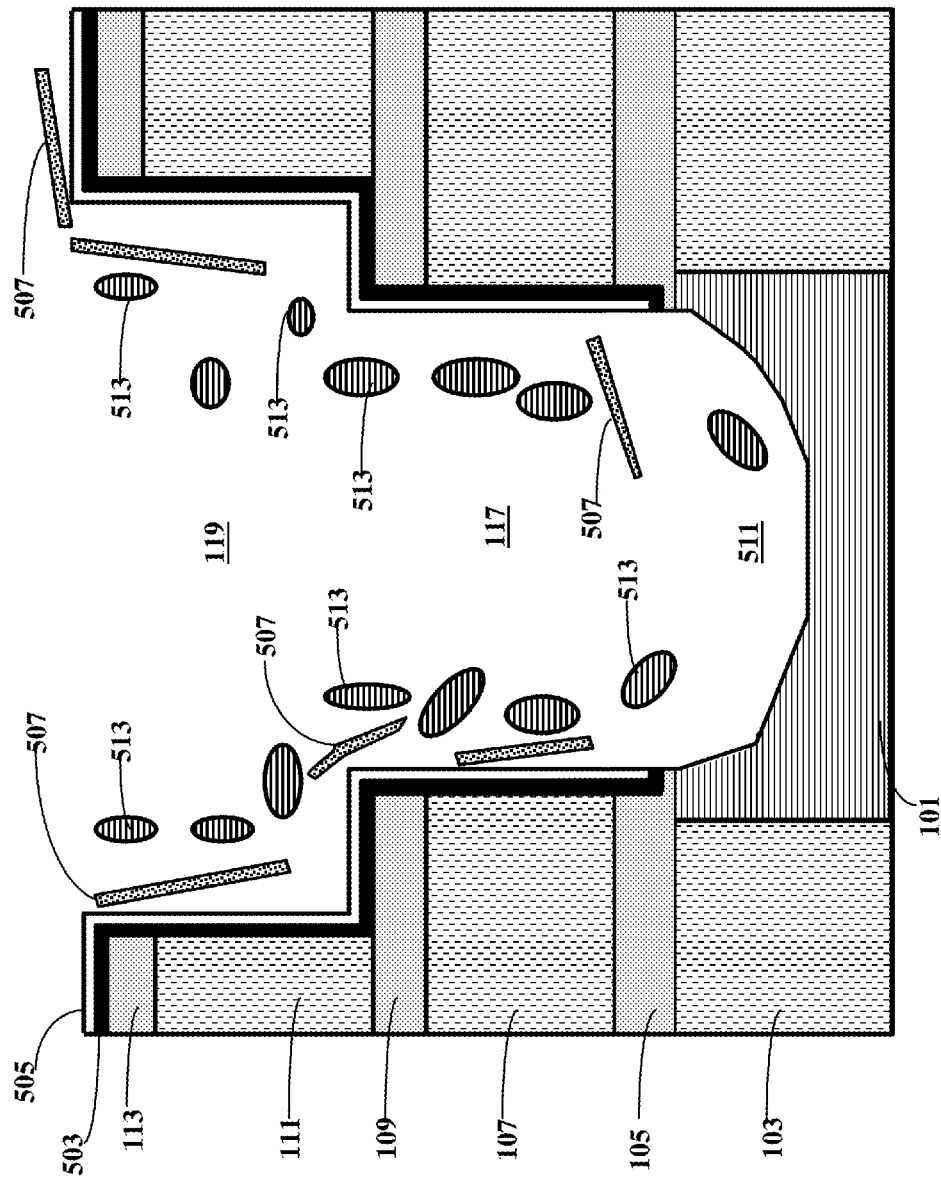

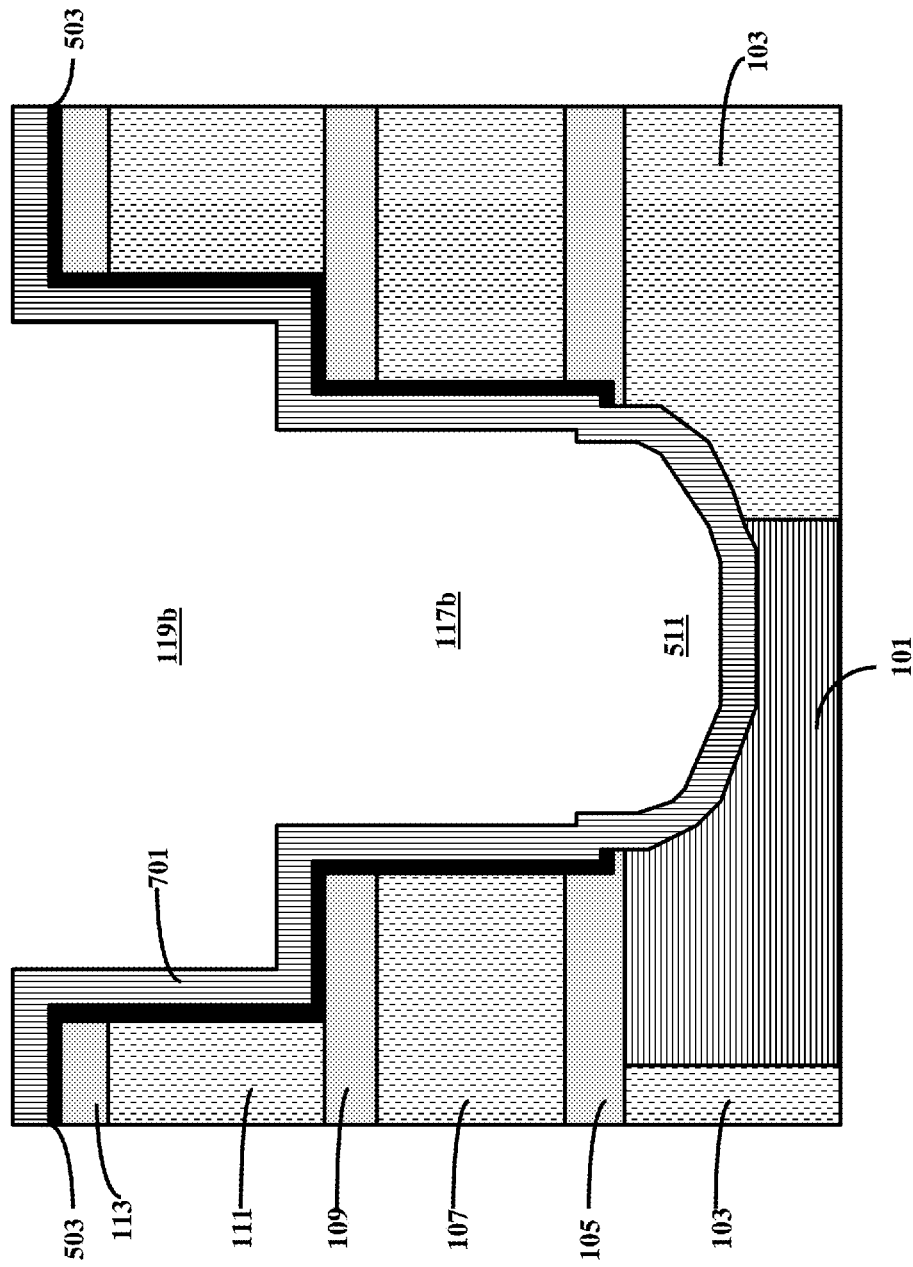

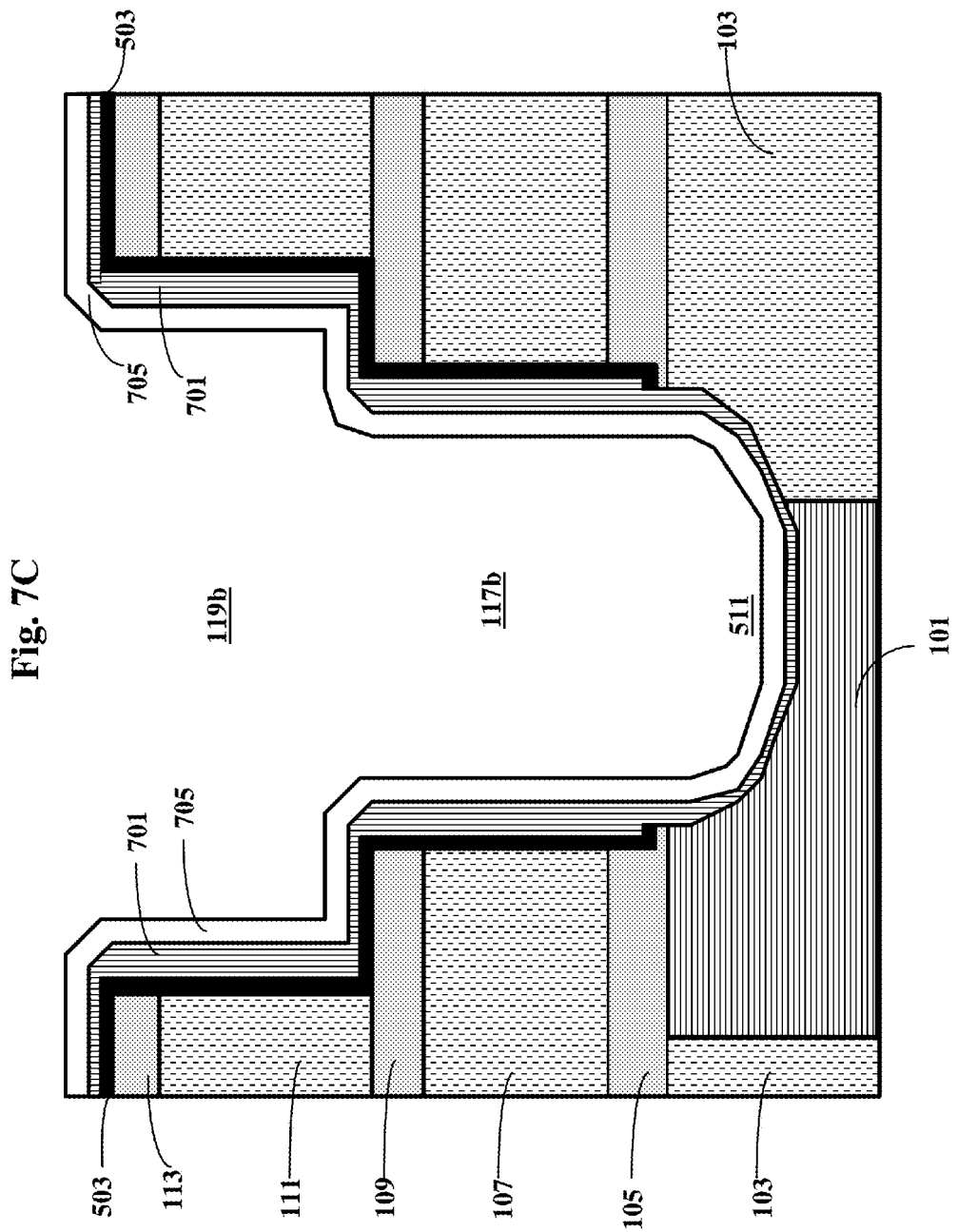

HIGH YIELD AND HIGH THROUGHPUT METHOD FOR THE MANUFACTURE OF INTEGRATED CIRCUIT DEVICES OF IMPROVED INTEGRITY, PERFORMANCE AND RELIABILITY

This application is a continuation-in-part of U.S. non-provisional patent application Ser. No. 12/339,033, filed on Dec. 18, 2008 which claims priority from U.S. provisional patent application Ser. No. 61/014,686, filed on Dec. 18, 2007, both of which are incorporated herein by reference.

FIELD OF THE INVENTION

This invention generally relates to the manufacture of integrated circuit devices, and more particularly to providing advanced damascene processes and structures.

BACKGROUND OF THE INVENTION

Recently, many device manufacturers are using damascene interconnect systems for the fabrication of integrated circuit devices. Contrary to the fabrication method of Al-alloy-based interconnects that comprises the deposition of Al-based alloy layer and plasma etch (i.e., reactive ion etch, dry etch or patterning etch) of it, the damascene counterpart comprises filling a damascene opening (i.e., a damascene feature) with a conductor. In typical damascene processes, copper (Cu) is used to fill the damascene feature as a conductor.

Although the damascene process has been used in the microelectronic industry for many years, various problems of IC device performance, reliability, yield and throughput have been reported in prior art damascene process cases. Ever-shrinking integrated circuit dimension makes the problems more pronounced.

Many of such problems found in the prior art damascene processes are closely related to the contamination and the damage caused by the prior art damascene processes to the materials constituting a damascene interconnect system, such as an interlevel dielectric (ILD) layer, conductors, and conductive liner layers. Many other unique problems of each damascene process will be explained as well in the following.

When a fabrication process of a contact opening, such as a via hole that is formed for the fabrication of both single and dual damascene interconnect systems exposes the conductor formed in a substrate at the bottom of the contact opening (in other words, 'at the contact opening bottom' and 'at the via bottom'), the material damage and the contamination may occur. Depending on the context, the phrase of "at the via bottom" may have a meaning of "at a location on the bottom side of a via or via hole" or "at a location beneath a via bottom or a via hole bottom," The conductor formed in a substrate is referred as a lower level conductor as well.

The first process that exposes the conductor may be the barrier open process (i.e., via open process) of the prior art damascene-feature-forming processes, wherein the conductor formed in a substrate is exposed to reactive and energetic environments when the last portion of a dielectric layer, such as the last portion of the via etch stop layer (via ESL) deposited over the conductor is etched through at the bottom of a via hole (in other word, 'at the via bottom').

Note that damascene features including those fabricated by the present invention, such as a single damascene contact hole and a dual damascene feature comprising a trench and a via hole, are generally formed by a damascene-feature-forming process within a dielectric layer deposited over a substrate that has the lower level conductor. By filling the damascene features with a conductor that is either identical to or different from that included in the substrate, various damascene interconnect systems can be fabricated. Both the conductor that is filling the damascene features and the conductor that is formed in the substrate can be fabricated with any kind of electrically conductive material. Usually, however, they comprise at least one material selected from a group comprising carbon, pure metal materials such as copper and tungsten, metal alloys such as copper alloys and aluminum alloys, metal silicides such as nickel silicide, metal oxides such as tin dioxide, metal nitrides such as tantalum nitride, metal carbides such as TaC, metal borides such as $TiB_2$, metal carbonitrides such as TaCN, and doped silicons.

The contact hole and the via hole are related. The term "hole" and the term "opening" are inter-changeable with each other. The substrate may be a silicon (Si) wafer or a glass sheet, or other material body, such as a GaAs wafer. The substrate may include other components than the conductor, such as semiconductor components, e.g., a transistor. The dielectric layer comprises either a single dielectric material layer or a composite of multiple dielectric layers. The composite of multiple dielectric layers comprises one or more interlevel dielectric (ILD) layers and one or more other dielectric layers than the ILD layers. Each of the ILD layers may comprise a silicon dioxide or a material layer whose dielectric constant is lower than that of the silicon dioxide. Each of the aforementioned other dielectric layers has one or more functions selected from a group comprising functions of a capping layer, a dielectric diffusion barrier layer, a passivation layer, a chemical mechanical polishing (CMP) stop layer, and an etch stop layer (ESL) such as a via etch stop layer (via ESL) and a trench etch stop layer (trench ESL).

FIG. 1 shows an exemplary dual damascene feature whose via ESL 105 has been removed completely at the bottom of the via (via bottom) so that the top surface 127 of the uppermost conductor, $M_x$ 101 formed within a substrate (i.e., lower level conductor) is exposed after a barrier open process. The damascene feature comprises a trench 119 and a contact opening (i.e., via hole 117) that are formed within a dielectric layer comprising ILD layers 107, 111, and other dielectric layers 105, 109, 113 than the ILD layers. In this disclosure, the other dielectric layers 105, 109 and 113 are named as a via ESL, trench ESL, and CMP stop layer, respectively. The top surface of the trench ESL 109 constitutes a trench bottom 123, and that of the CMP stop layer 113, a field area 114. Each of the other dielectric layers may have other function or functions than that implied by its name, as aforementioned. This damascene feature that has no dielectric layer retained at the via bottom is used for the fabrication of prior art dual damascene interconnect systems each of which has either an embedded via or a planar via. Note that the damascene feature shown in FIG. 1 can also be used as a preliminary damascene feature in an embodiment of the present invention as will be explained. In this disclosure, a preliminary damascene feature is a damascene opening, such as a single contact hole and a dual damascene opening that comprises a contact hole, over which a sacrificial layer is deposited prior to exposing a conductor formed in a substrate at the contact hole bottom. Each of the aforementioned dielectric layers 105, 107, 109, 111, 113 can be either a single material layer or a composite of multiple material layers.

Since the thorough removal of the via ESL at the via bottom during the barrier open process is a necessity for the formation of the prior art damascene interconnect systems having either a planar via or an embedded via, the top layer of the conductor $M_x$ 101 can be etched away unintentionally, and recessed as illustrated in FIG. 1 (see location 127) during the barrier open process.

Problem 1) ILD contamination by conductor materials: If the conductor are etched by the barrier open process, the ILD layers 107, 111 can be contaminated by the materials constituting the conductor $M_x$ 101 since the conductor materials, such as copper (Cu) can be subsequently re-deposited as a form of conductor-material-rich post etch residue (PER) on the surface of the ILD layers (e.g., 121 and 125). If the conductor is Cu, it can diffuse fast into the ILD materials, causing IC reliability problems such as dielectric breakdown. Even if the conductor comprised other metals than Cu, their migration to the ILD layers may cause similar problems.

Problem 2) Contamination and damage by halogen- and hydrogen-containing chemistries: Next, the surface 127 and the inner portion 115 of the conductor, $M_x$ may be contaminated by halogen atoms during a barrier open process, if a halogen-containing chemistry are used. If this happened on the surface of a Cu conductor, Cu halides that cannot be removed via a thermally driven evaporation mechanism would form, adversely influencing the performance and reliability of the damascene interconnect system. Although a plasma of reducing chemistries, such as hydrogen plasma and $NH_3$ plasma, can remove halogen atoms from the Cu halides during a pre-clean process before the deposition of a conductive liner layer, hydrogen-related problems, such as Cu hydride and Cu hydroxyl impurity formation, can be caused to the conductor. Since the ILD layers are exposed to the chemistry of the pre-clean process, any hydrogen-containing plasma chemistry can cause problems to ILD layers, especially to those consisting of low K dielectrics, such as Flare™, SiLK™ and carbon-doped silicate glasses.

Problem 3) Limited choices for barrier open process chemistry for prior art damascene-feature-forming process: Another type of damage that can happen to the conductor (e.g., $M_x$) at the via bottom might be its oxidation during the barrier open process if an oxygen-containing plasma chemistry were used. This is because the barrier open process exposes the conductor to its chemistry in the prior art damascene process scheme. Therefore, an oxidizing chemistry cannot be used for the barrier open process during the prior art damascene-feature-forming process, even though it might provide various advantageous merits, such as good feature profile controllability and high etching speed.

Problem 4) Difficulties in removing the persistent PER: Yet another problem caused by the complete via ESL removal that is accompanied by the unintentional etch back of the conductor materials during the barrier open process, may be the difficulty in removing very persistent metal-rich post etch residues (PERs), such as organometallic polymer residue (i.e., hydrocarbon-based polymer containing the elements of $M_x$) by using a wet clean chemistry without causing further problems, such as undercut, ILD lift-off, critical dimension loss (CD loss), conductor corrosion, and organic metal formation. Exposing conductor during a damascene-feature-forming process is thus responsible for a slow, complicated and costly wet clean process, degraded device performance, undesirable feature profile, poor device reliability, low throughput, and decreased device yield.

The cause of the problems listed above is rooted in the fact that the last layer of the dielectric layer, such as the via ESL is completely removed during the conventional barrier open process step. In order to mitigate the problems, via open processes have been performed carefully during prior art damascene-feature-forming processes so as to suppress the etch back of the conductor. However, it is close to impossible to remove the dielectric layer completely without etching back the conductor (e.g., $M_x$) at all. Providing a viable damascene-feature-forming process that can prevent or mitigate the aforementioned problems is within the scope of the present invention.

Following are further problems of prior art damascene processes in addition to those caused by the prior art damascene-feature-forming process. In a prior art damascene process, damascene features, such as the one shown in FIG. 1 are then provided to subsequent process steps for fabricating a via alone in a single damascene via fabrication case, or a via and an one-level upper interconnect line than the conductor formed in a substrate in a case of fabricating a dual damascene interconnect system.

A via formed by a prior art damascene process can be classified either as a planar via or an embedded via. The prior art planar via has been formed while avoiding the removal of underlying conductor materials intentionally in any step of a damascene process. Note that a planar via formed by a prior art damascene process might be unintentionally embedded in the conductor of the substrate a little due to the inevitable etch back of the conductor during the conventional damascene-feature-forming process as aforementioned.

Refer to FIG. 2A for an exemplary prior art dual damascene interconnect system comprising a planar via ($V_x$ 203a), and a next level (in other words, an upper level) conductor ($M_{x+1}$ 201) both of which are covered by a conductive liner layer (i.e., 205), and formed over a conductor $M_x$ 101 that is formed in a substrate. The damascene process steps for fabricating this damascene interconnect system, however, can cause a multitude of problems as listed below.

Problem 5) Limited options for pre-clean processes, and their inefficiency: Typically, a gentle hydrogen-plasma-based pre-clean process has been performed prior to the deposition of the conductive liner layer 205 to remove the contaminants from the top surface of the conductor at the bottom of the via 203a (via bottom). This is because any intensive process, such as an argon (Ar) sputtering, may cause serious problems related to the contamination to the damascene feature surface by sputtered conductor materials, such as Cu. This means that the surface of the conductor at the via bottom may not be cleaned sufficiently prior to the deposition of a conductive liner layer due to the limited choices. Ever-decreasing critical dimension of the damascene feature can exacerbate the problem of the pre-clean process. Also, any prolonged hydrogen-plasma-based pre-clean process can damage ILD materials, such as Flare™ and SiLK™, and can enlarge critical dimensions (CDs) of damascene features, such as trench width and via diameter.

Problem 6) Poor electrical and mechanical property of a planar via: Since no further removal of contaminated and damaged material from the top surface of the conductor at the bottom of the planar via 203a is performed after the pre-clean process in the damascene process scheme used for fabricating a damascene interconnect system having a planar via (i.e., damascene process for fabricating a planar via), any contamination or damage that has not been removed by the pre-clean process can be trapped along the border line 207 between the conductive liner layer 205 and the underlying conductor 101 shown in FIG. 2A, and cause electrical problems, such as a high via resistance, and thermo-mechanical problem, such as via pull back. The significant thermal and mechanical stress caused by the damascene process may exacerbate these problems.

Problem 7) Problem of planar via disconnection due to void formation: Another problem arises when a void is formed in the via (not shown) or in the underlying conductor (see FIG. 2B) due to various reasons, such as Cu electromigration (EM). As shown in FIG. 2B, if the conductor $M_x$ 101 had a void 209 whose size is large enough to disconnect the via 203a from the $M_x$, the planar via is no longer able to carry sufficient electrical current from $M_x$ 101 to $M_{x+1}$ 201, or from $M_{x+1}$ 201 to $M_x$ 101. As the number of the unlanded vias such as that shown in FIG. 2B increases in a die with decreasing feature size, the disconnection problem of the planar via worsens.

Problem 8) Problem of low yield and high production cost of a planar via: Furthermore, due to the aforementioned problems, the damascene process for fabricating an interconnect system having a planar via may suffer a low production yield, which is the largest contributor to a high production cost.

An ideally fabricated embedded via can remove the aforementioned problems related to the planar via (see FIG. 2C and FIG. 2D for an ideally fabricated embedded via). The ideally fabricated embedded via is a via formed by an ideal damascene process that does not cause damage or contamination to the materials constituting the damascene interconnect system having the embedded via. Forming the ideally fabricated embedded via is within the scope of the present invention.

Since any damaged and contaminated material existing at the via bottom area along the border line 207 between the conductive liner layer 205 and the underlying conductor 101 shown in FIG. 2A is physically removed during the formation of the ideally embedded via, the aforementioned problem of poor electrical performance can be removed. Also, extending the tip 211 of via 203b into $M_x$ to embed it in the $M_x$ three dimensionally can significantly reduce the mechanical vulnerability of a via, compared to the planar via that is contacting underlying conductor two dimensionally. Furthermore, even if there is a large void 213 (provide that its size is the same as that of the void 209 shown in FIG. 2B) in the via or in the conductor (not shown), the embedded via is still able to carry electrical current, as illustrated in FIG. 2D, thus improving the reliability of integrated circuit devices. Moreover, the area for electrical conduction 215 of a planar via can be severely reduced if it is unlanded as depicted in FIG. 2E. By embedding a via, the area for the electrical conduction 217 can be enlarged, as described in FIG. 2F.

However, forming an ideally embedded via by using a prior art damascene process used for the embedded via formation may be difficult. One of the many reasons is that the prior art embedded via formation process, which is also called as a punch-through process comprises an etch back of already-deposited conductive liner layer at the via bottom, together with the conductor formed in the substrate, causing contamination and damage to the materials that constitute a damascene interconnect system. In addition to the damage and contamination problems, the prior art damascene process has other intrinsic problems.

FIG. 3A through FIG. 3D show steps that are carrier out in an exemplary damascene process selected to explain possible damages and contaminations related to prior art damascene processes used for the formation of an embedded via. In the exemplary process, the conductive liner layer comprising a conductive diffusion barrier layer and an adhesion layer is deposited by a sputtering method, which is a widely used PVD method for the manufacture of the prior art damascene interconnect system. Even if the exemplary process explained in FIG. 3A through FIG. 3D might be slightly different in its details from the prior art processes used in the industry, many of its process steps are implemented in the prior art processes.

FIG. 3A shows an as-deposited conductive diffusion barrier 311 that was deposited by the sputtering method on an unlanded via pattern. The sputtering method often forms overhang structures such as 305 and 309 at the entrance of the via hole 117, and that of the trench 119, respectively, together with a thick barrier material deposit 301 at the via bottom. The overhang structures often cause thin diffusion barrier on the via bottom sidewall 303 and that on the trench bottom sidewall 307 that would in turn cause Cu diffusion through them. The large volume occupied by the overhanging conductive diffusion barrier material 305 and 309, and the thick conductive diffusion barrier material 301 at the via bottom can cause a problem of high interconnect resistance.

To solve the various problems originated from the intrinsically poor conformality of the sputter-deposited conductive diffusion barrier layer and to form a recess in the underlying conductor for the formation of an embedded via, an intensive etch back process has been performed during or after, or during and after the deposition of the conductive liner layer in the prior art damascene processes. It has been expected that by the intensive etch back process, the thick conductive liner layer material at location 305, 309 and 301 are etched back, and the materials etched back (re-sputtered) are redistributed to reinforce the thin conductive diffusion barrier layer 303 and 307.

However, this intensive etch back of growing or already-grown conductive liner layer for the formation of embedded via through forming a recess in a conductor at the via bottom can cause various grave problems as illustrated in FIG. 3B.

Problem 9) Integrity loss of materials involved due to physical damage: The intensive etch back process can harm the integrity of the conductive diffusion barrier layer by bombarding it heavily on a wide scale. Also, the intensive etch back process can locally cause the formation of micro-trenches at thin spots such as the trench bottom corner 323a and via bottom corner 323b, 323c, due to one or more reasons, such as unevenly distributed electrical charges along the materials' surface, concentrated ion flux reflected by the overhangs and then directed toward the bottom corners of the via and the trench, and overly formed bias voltage on the substrate. The depth of the micro-trench 323c, for example, in the substrate dielectric layer 103 can become large if the resistance of the material constituting the dielectric layer 103 against the re-sputtering is significantly weaker than that of the conductive diffusion barrier material. Once formed, these micro-trenches can cause Cu diffusion through them to the dielectric layers 103 and 107. Since they are usually too narrow and too deep, subsequently deposited material layer by the sputter method, such as the adhesion layer 331 (see FIG. 3C), may not be able to seal them conformally. Depositing a thick adhesion layer that also functions as a conductive diffusion barrier layer, such as tantalum and $TaN_x$ (0<x≤0.1), in an attempt to seal the micro-trench would increase the resistance of the whole interconnect system.

Problem 10) Contamination by etched back materials: The second problem of the intensive etch back process for forming a recess in the conductor may be the integrity loss of the conductive diffusion barrier layer due to the contamination caused by the byproduct materials of the etch back process. Since this etch back process is done during or after, or during and after the deposition of the conductive diffusion barrier, this barrier surface can be re-deposited with the byproduct of the etch back process (e.g., composite impurity particles 325 comprising the materials of the diffusion barrier 311, ILD layers 103 and 107, and the underlying conductor, $M_x$ 101), as shown in FIG. 3B. If, for example, the conductor comprised Cu, the Cu atoms etched back from the conductor and re-deposited on the surface of the conductive diffusion barrier layer as a form of the impurity particle may be bombarded heavily by the energetic ions of the etch back process, and incorporated deeply into the conductive diffusion barrier layer. The deeply incorporated Cu atoms have a high chance to diffuse through the conductive diffusion barrier layer to the ILD layer. Under this situation, the property and the integrity of the ILD layer and the conductor can get deteriorated as well.

Problem 11) Faceting of trench and via entrance: Moreover, the intensive etch back process may cause faceting of the ILD at the trench entrance area 329 or at the via entrance area 326, or both. The diffusion barrier layer can also be faceted 327 at the trench entrance as shown in FIG. 3B. The faceting at the trench entrance 327, 329 can result in a decreased distance between neighboring interconnect lines, causing increased current leakage and signal interference between them. Also, the faceting at the via entrance can make neighboring vias (not shown in this figure) merge each other.

Problem 12) Non-uniform effect of the etch back process: A further problem of the etch back process performed over the sputter-deposited (PVD-grown) conductive diffusion barrier layer is the non-uniformity in its effects. More specifically, the effects of the etch back process, such as the depth of the recess formed into the conductor $M_x$ 101, the severity of the micro-trench formation, and the degree of the faceting can change from feature to feature within a die on a substrate in an uncontrollable manner, as the aspect ratio of the damascene features, such as a via hole, varies. The most significant effect of the non-uniformity can be a severe yield drop of device production that is related to the recess depth non-uniformity. This is because, if the depth of a recess formed by the etch back process changes from via hole to via hole so that the conductive diffusion barrier layer is not punched through at the bottom of many via holes, the final vias formed in these via holes can show unallowably high via resistance for many reasons.

The significant non-uniformity in the effect of the etch back process is originated from a large variation in the topological characteristics of the sputter-deposited conductive diffusion barrier layer that is extremely sensitive to the change in the aspect ratio of the features in a die. Note that the topological characteristics, such as the overhang 305, 309 of the conductive diffusion barrier layer has a significant impact on the results of the etch back process.

Problem 13) Limited options for a barrier material and its deposition method: Changing the deposition process of conductive diffusion barrier layer from the sputter deposition method of poor conformality to a higher conformality counterpart method may be helpful in removing the significant non-uniformity in the effect of the etch back process since the topological characteristics of the more conformal diffusion barrier layer may not change much with changing aspect ratio of the damascene features within a die. Moreover, switching the barrier deposition method for an improved conformality of the conductive diffusion barrier layer is in accordance with the technology trend of which a conductive diffusion barrier of as smallest thickness and highest conformality as possible is required to reduce the volume occupied by the conductive liner layer within a damascene feature. One of such ideal material layers may be a PEALD-grown tantalum carbonitride (can be abbreviated to either TaCN or TaNC) layer of the highest conformality.

However, the prior art damascene processes used for the fabrication of damascene interconnect system having an embedded via (i.e., the punch-through approach) may not be able to adopt any kind of material layer that shows a very high conformality as a conductive diffusion barrier layer. This is because the diffusion barrier layer deposited on the trench bottom 123 (see FIG. 1) can be completely removed by the time when the diffusion barrier layer deposited on the bottom surface 127 of the via is punched through. This is problematic in the case of a damascene process scheme wherein the trench ESL 109 is not deposited in an attempt to decrease an overall dielectric constant of the whole interconnect system. In this situation, any conductor filled into the damascene feature (see FIG. 1) would be leaking through the trench bottom from which the conductive diffusion barrier layer has been removed by the intensive etch back process for forming a recess in the conductor.

Therefore, the prior art damascene processes may have to keep relying on the sputter deposition (PVD) method that deposits a thicker film on the trench bottom than on the bottom surface 127 of the via for the diffusion barrier layer deposition to avoid the damage of the barrier layer on the trench bottom 123, albeit the poor conformality of the as-deposited diffusion barrier may cause aforementioned problems.

The other potential problem of the prior art punch-through approach may arise in selecting a diffusion barrier material. By adopting a conductive diffusion barrier layer of the highest effectiveness, the thickness of the diffusion barrier layer can be maintained as small as possible to comply with the technology trend. This in turn means that the conductive diffusion barrier layer may have to comprise a material of a high bonding force that helps it block other atoms from migrating through it. Note that this high bonding force of a material often makes it more resistant against re-sputtering action used in the punch-through process. The significant problem of the prior art approach for forming the embedded via is, thus, the increasing difficulty in punching the conductive diffusion barrier layer through at the via bottom as the resistance of the barrier material against re-sputtering increases. It means that one may not be able to use very promising conductive diffusion barrier layers, such as a tantalum nitride of a high nitrogen concentration (e.g., PVD-grown $TaN_y$, y>0.1) and the PEALD-grown TaCN layer for the prior art damascene process designed for the fabrication of an interconnect system having an embedded via, if these materials have high resistance against the re-sputtering action of the prior art process.

Providing a promising method that allows the use of the highly conformal and highly efficient conductive barrier layer, regardless of its resistance against the re-sputtering, for the formation of a damascene interconnect system having an embedded via without causing aforementioned problems is within the scope of the present invention.

Problem 14) Loss of an adhesion layer's conductor-grabbing property: Another problem of the prior art damascene process of the punch-through approach may be related to the contamination of the adhesion layer with impurities during its deposition process. FIG. 3C illustrates an adhesion layer 331 deposited over the conductive diffusion barrier layer 311 that has been intensively etched back during the recess formation process step performed as a preparation step for the embedded via fabrication.

Since most of the PVD processes used for material layer growth in prior art damascene processes use highly energetic ion species that usually pick up materials from a layer underlying a growing layer, and deposit the materials in the growing layer, the adhesion layer 331 growing on the conductive diffusion barrier layer 311 that is contaminated with the composite impurity particles 325 can be easily contaminated with the components of the impurity particles.

Since adhesion layers work better when they are in highly pure state in general, the contaminated adhesion layer may not grab or hold the conductor material layer (e.g., Cu seed)

overlying it very well. As a consequence, the contaminated adhesion layer can cause the peeling or agglomeration of the conductor layer 334 as illustrated in FIG. 3D.

Once this peeling or agglomeration of the seed layer happened during a damascene process, subsequent conductor deposition by an electrochemical deposition (ECD) process may fail due to the discontinuous electrical path (e.g., peeled or agglomerated Cu seed layer on the contaminated adhesion layer). The contamination of adhesion layer can also be responsible for a fast failure of Cu interconnects during the use of IC devices since the lost or reduced Cu-grabbing power of the adhesion material makes Cu electromigration (EM) happen more easily.

The aforementioned problems can be too severe to be solved by a minor change in the sequence and the parameters of the prior art damascene processes. An example of such a minor sequence change would be found in the prior art approach of Chung et al. (U.S. Application Publication 2005/0106865) in which a conductive diffusion barrier and an adhesion layer are deposited consecutively, followed by the punch-through of these two layers altogether to form a recess at the via bottom, then followed by the deposition of another adhesion layer.

SUMMARY OF THE PREFERRED EMBODIMENTS

Aforementioned problems are generally solved, mitigated or prevented by preferred embodiments of the present invention that provides various methods to fabricate damascene features and damascene interconnect systems using a sacrificial layer.

BRIEF DESCRIPTION OF THE DRAWINGS

FIG. 1 illustrates a prior art dual damascene feature formed after performing a barrier open process.

FIG. 7A illustrates a conductive diffusion barrier 701 deposited over a final dual damascene feature surface lined with the retained sub-layer 503 of the sacrificial layer, and over the surface of the recess formed in a conductor at the via bottom.

FIG. 7C shows an example of an adhesion layer 705 that is deposited over the thinned conductive diffusion barrier 701.

DETAILED DESCRIPTION OF THE PREFERRED EMBODIMENTS

Figure 2:
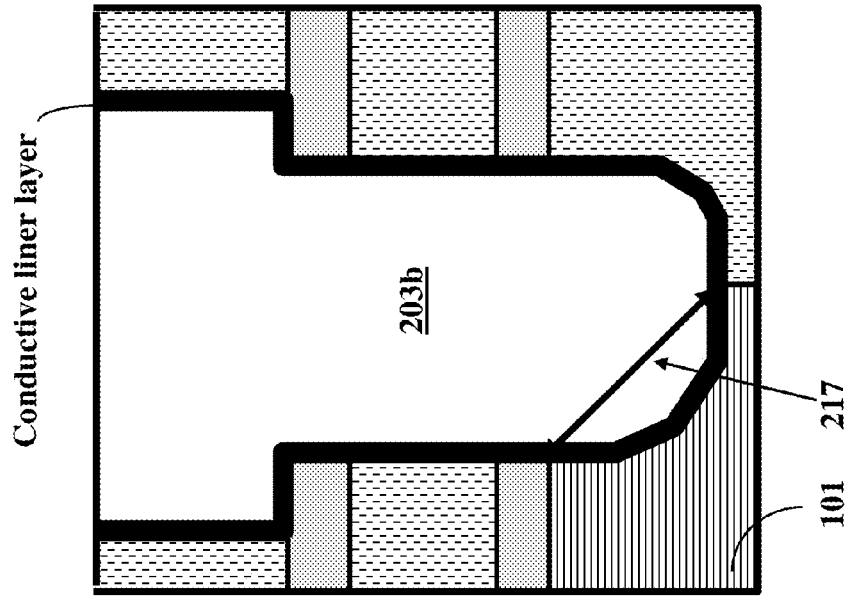
FIG. 2A illustrates an exemplary landed planar via that is in contact with underlying conductor two-dimensionally.
FIG. 2B illustrates the discontinuity of electrical path, which is one of many problems of a planar via that is two-dimensionally contacting an underlying conductor 101.
FIG. 2C illustrates a landed embedded via that is in contact with an underlying conductor 101 three-dimensionally.
FIG. 2D illustrates how the discontinuous electrical path problem can be avoided by forming an embedded via.
FIG. 2E illustrates a reduced electrical conduction channel 215 between a planar via 203a and an underlying conductor 101 when the via is unlanded.
FIG. 2F illustrates an enlarged electrical conduction channel 217 between an unlanded via and an underlying conductor 101 by embedding the via 203b into the conductor.
Figure 2:
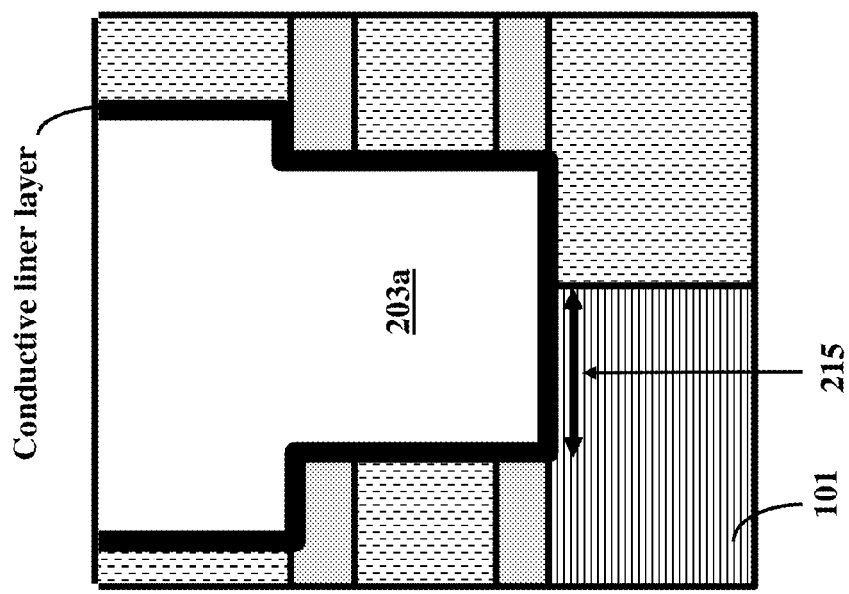
Figure 3:
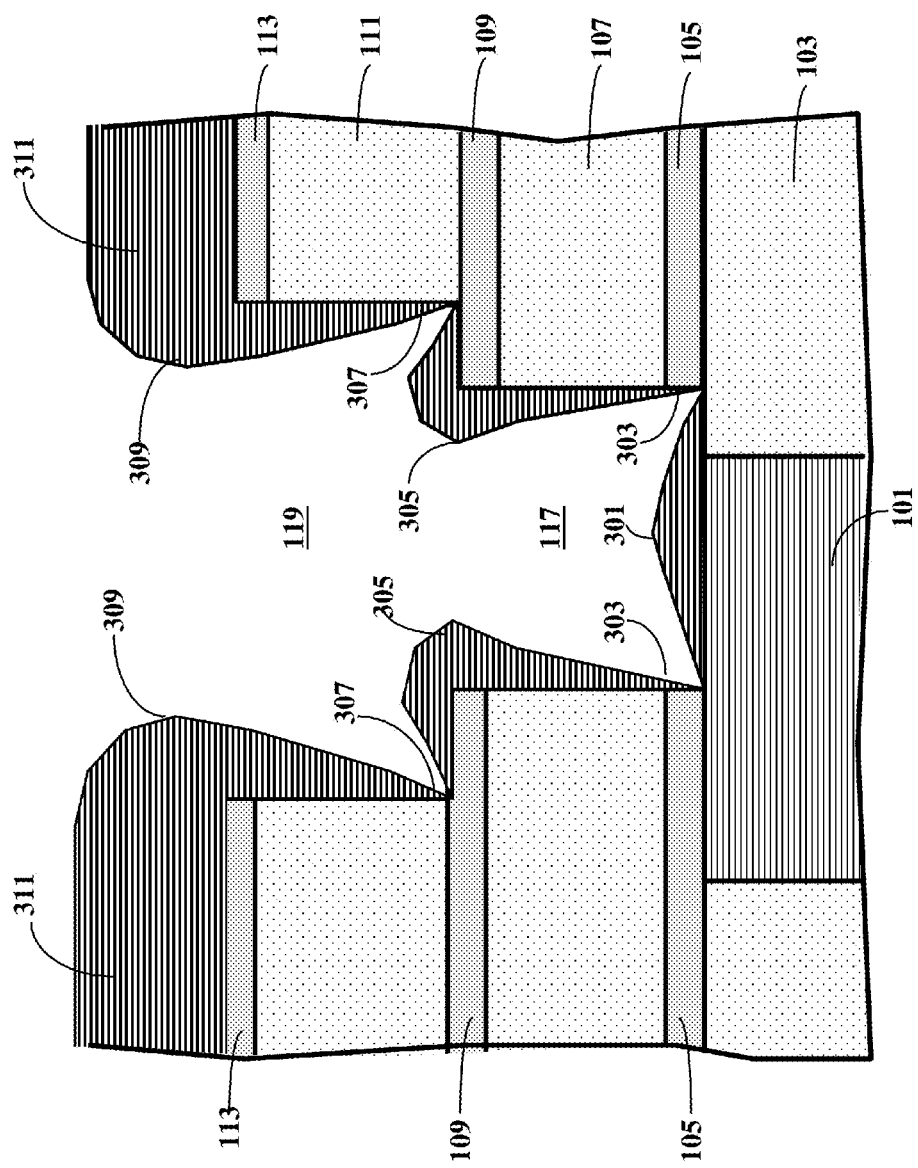
FIG. 3A illustrates topological characteristics of an as-deposited conductive diffusion barrier layer deposited by a PVD method over a dual damascene feature having an unlanded via hole.
FIG. 3B illustrates potential problems that can be caused by an aggressive etch back performed in a damascene process to punch through an already deposited conductive diffusion barrier by a PVD method over a damascene feature having an unlanded via hole.
FIG. 3C illustrates potential problems that can arise during the deposition of an adhesion layer 331.
FIG. 3D illustrates a potential problem of discontinuous seed layer 334 caused by a contaminated adhesion layer.
Figure 3:
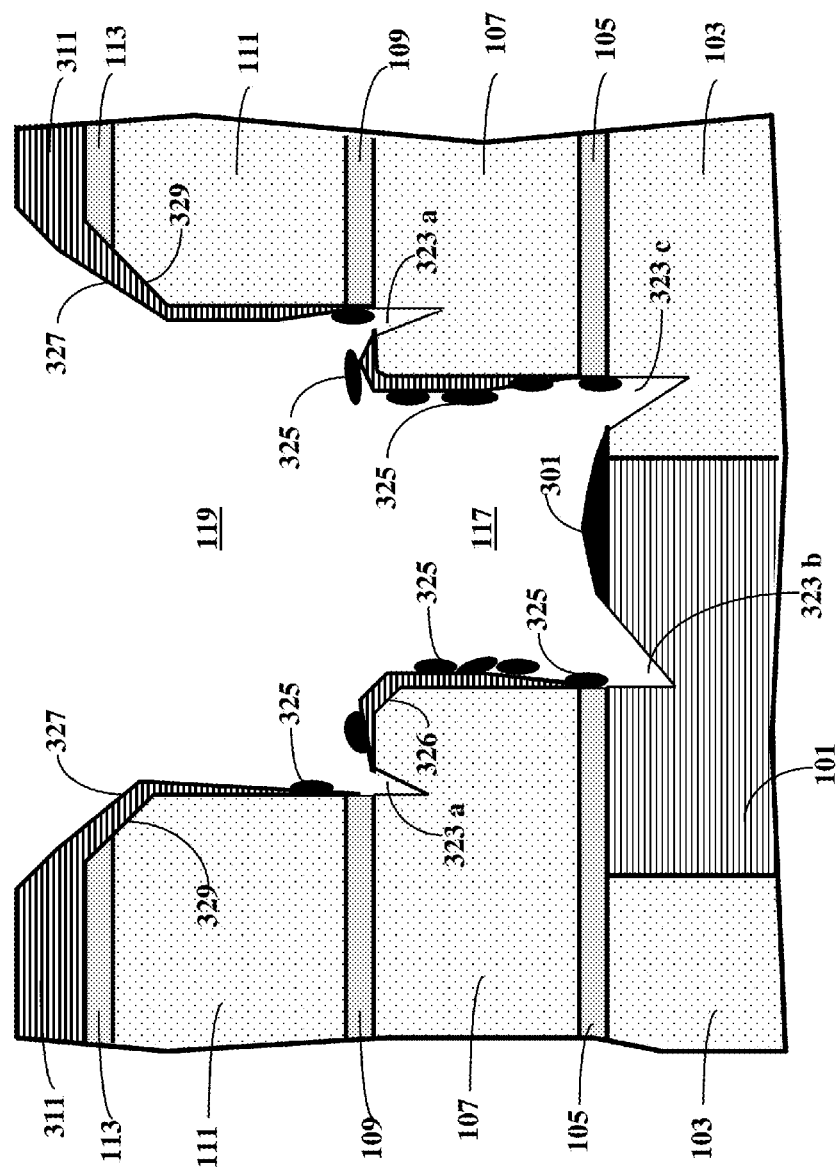
Figure 3:
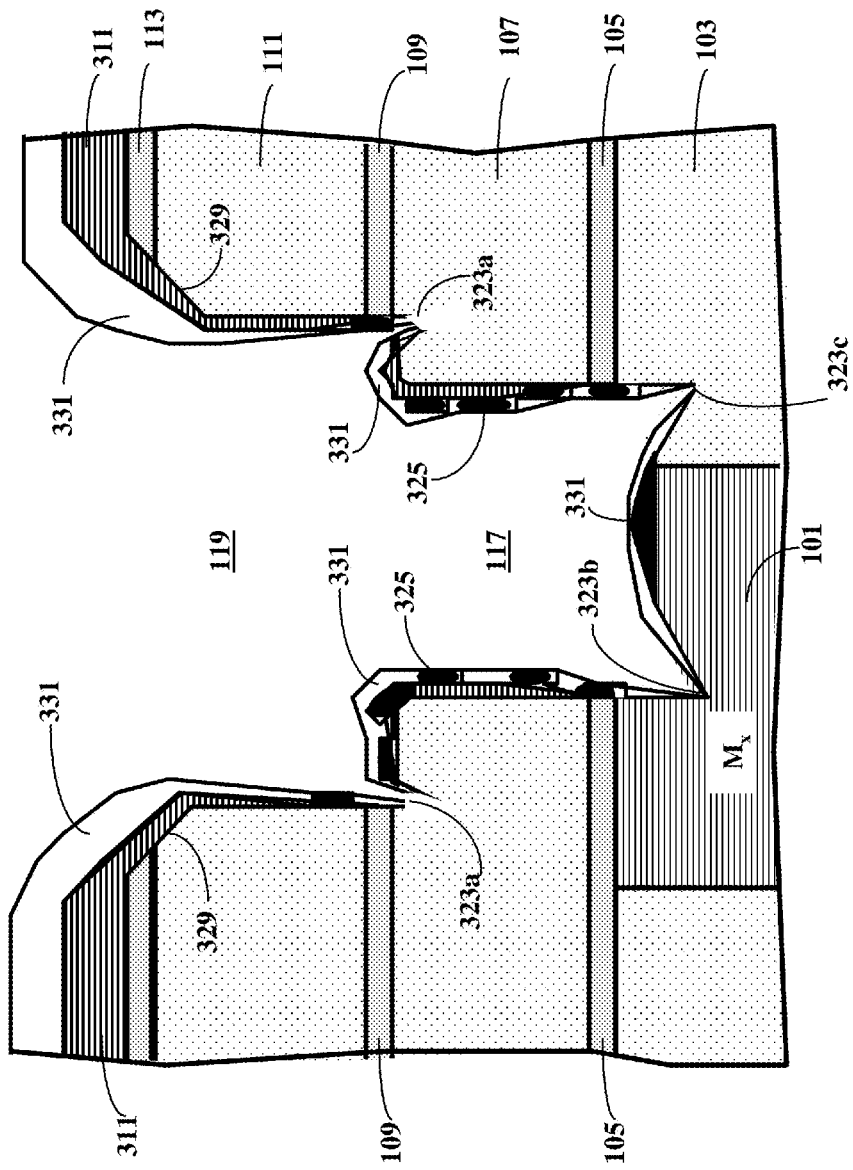
Figure 3:
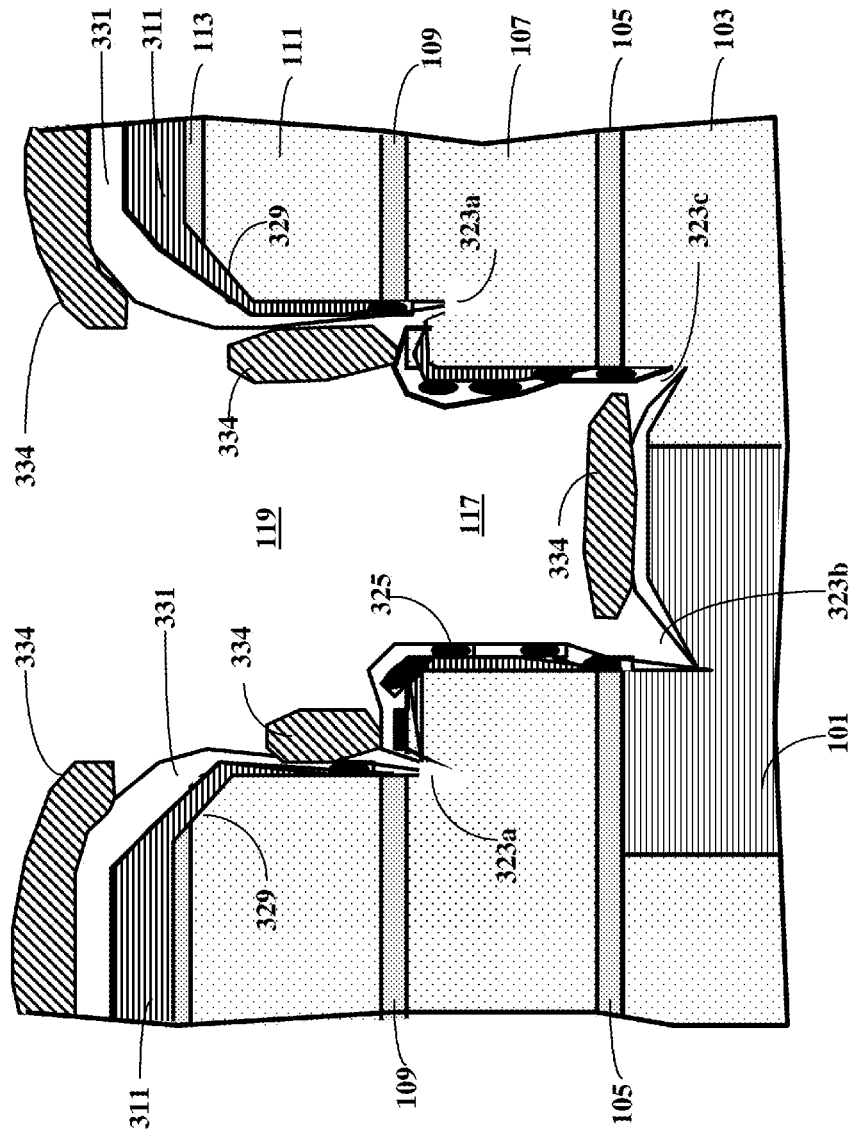

Before describing the present invention in detail, it is to be understood that unless otherwise indicated, this invention is not limited to a specific IC device, or the like, as such may vary. It is also to be understood that the terminology used herein is for the purpose of describing particular embodiments only and is not intended to limit the scope of the present invention. It must be noted that as used herein and in the claims, the singular forms "a," and "the" include plural references of "at least a" or "at least the", unless the context clearly indicates otherwise. Thus, for example, reference to "a precursor" includes "at least a precursor," thus covers two or more precursors. The drawings that are used to depict the present invention or to explain the background of the present invention are not scaled proportionately unless the context clearly indicates otherwise. Many of the features in the drawings are not drawn to show the actual shape or size of the features, but to explain general ideas that are relevant to the topics shown in the drawings.

This invention generally relates to the manufacture of integrated circuit devices. This invention specifically relates to methods, damascene features and damascene interconnect systems that are needed for fabricating advanced integrated circuit devices of improved performance and reliability at a high yield and high throughput, while preventing or mitigating the damage and the contamination of the materials constituting the damascene interconnect system, and while achieving other technical advantages. The present invention is preferably applied to copper (Cu) or Cu alloy interconnects, but can also be applied to other interconnects comprising other conductors (e.g., carbon, metals, such as Al, W, metal alloys, such as Al—Cu, and metal silicides).

The present invention is described with respect to presently preferred embodiments mostly in a specific context of a damascene process for fabricating a dual damascene interconnect system having a copper conductor as an interconnect material over a substrate having any kind of conductor. The present invention may also be applied to other damascene interconnect systems, such as a single damascene contact based on a tungsten stud formed as a contact metal over a device area. The specific embodiments discussed herein are merely illustrative of specific ways to make and use of the present invention, thus not limiting the scope of the invention.

A preferred embodiment dual damascene interconnect system having an embedded via fabricated by a preferred embodiment damascene process (novel damascene process) is illustrated in FIGS. 2C, D and F. The novel damascene process used for fabricating the most preferred embodiment damascene interconnect system is illustrated in FIG. 4 through FIG. 8. As will be explained below, and as would be understood by one of ordinary skill in the art, various modifications of the specific method and the structure of the interconnect system are possible without damaging the spirit of the present invention.

In the embodiment, a novel damascene-feature-forming process, which is a part of the novel damascene process, is first provided. This novel damascene-feature-forming process comprises depositing a dielectric layer over a substrate, etching a preliminary dual damascene feature, depositing a sacrificial layer, exposing at least a conductor (in other words, exposing the lower level conductor) at the bottom of the contact opening, and performing a residue removal process.

The etching a preliminary dual damascene feature can be done by performing a plasma etch process and a stripping process. It can, however, be done by performing a plasma etch process only without performing the stripping process. Moreover, the etching a preliminary dual damascene feature can also be performed by using a wet etch process. Such a wet process may use one or more wet etchants that are used in the wet clean process for the residue removal process mentioned below. The plasma etch process (also called as a reactive ion etch (RIE) process, dry etch process or patterning-etch process) generally comprises one or more processes selected from a group comprising a trench etch process, a via etch process (i.e., contact opening etch process), and a barrier open (also called as via open) process in the industry. In the novel damascene-feature-forming process, the plasma etch process comprises a trench etch process, a via etch process, and an incomplete barrier open process. This incomplete barrier open process means a plasma etch process in which the via etch stop layer (via ESL) is not completely removed at the via bottom. The stripping process comprises an ashing process or a wet clean process, or both in this disclosure. This wet clean process is performed to remove post etch residue (PER) or post ashing residue (PAR), or both, using one or more wet etchants. The novel damascene-feature-forming process is a part of the novel damascene process.

In the novel damascene-feature-forming process, therefore, a dielectric layer deposited over the conductor formed in the substrate is not etched through at the via bottom after performing the step of etching a preliminary dual damascene feature that comprises the incomplete barrier opening process, so as to form a preliminary contact opening (i.e., preliminary via hole) having a remaining dielectric layer at the via bottom, followed by depositing a sacrificial layer over at least a portion of the preliminary dual damascene feature, then followed by exposing the conductor at the via bottom. Preferably, the remaining part of the dielectric layer is a portion of or an entire via etch stop layer (via ESL) deposited over the surface of a conductor formed in a substrate. During the step of exposing the conductor, the retained part of the dielectric layer is then finally etched back preferably by a sputter etch process using a plasma of at least one inert gas, which is one of many anisotropic etch processes.

Figure 4:
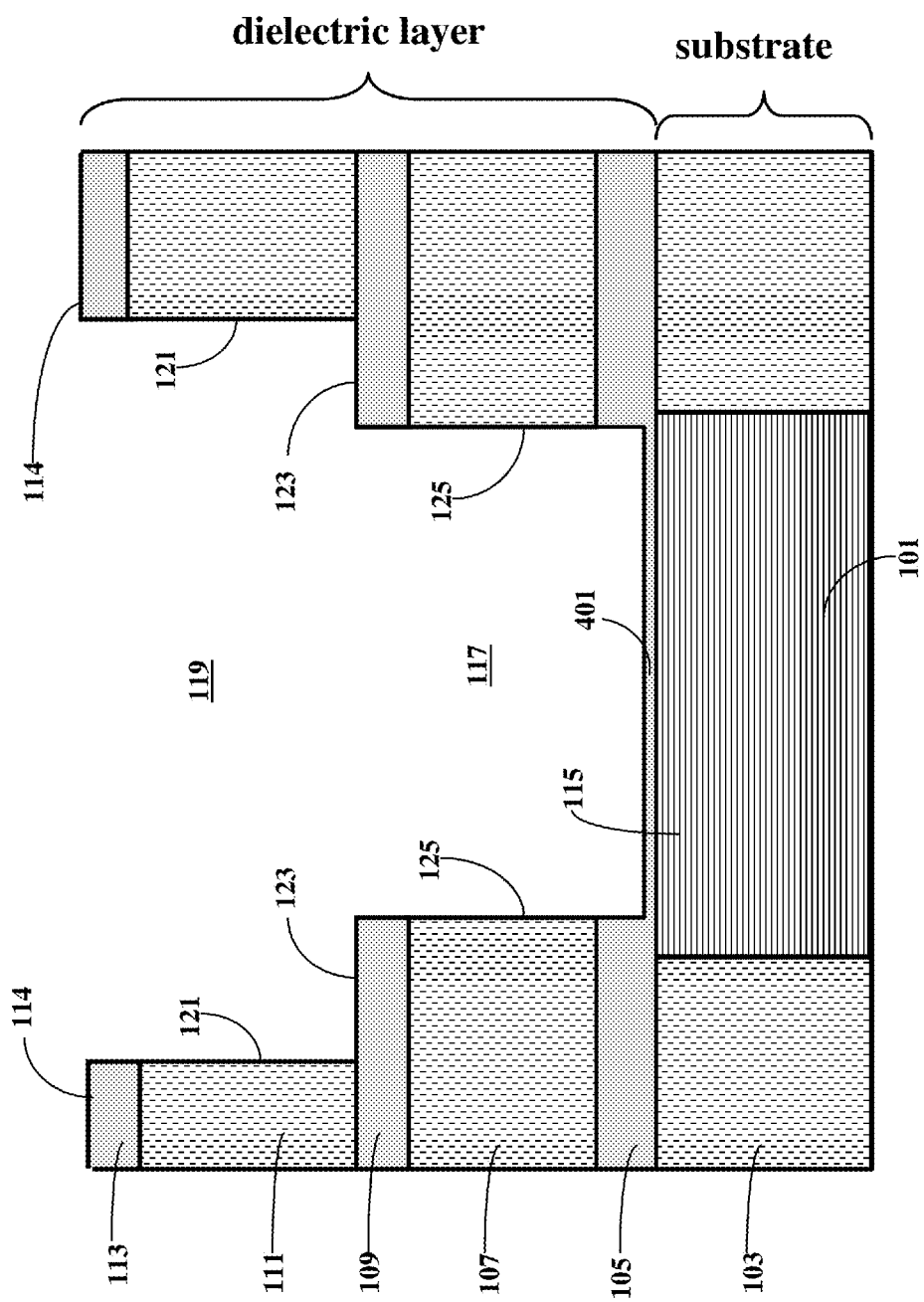
FIG. 4 shows an exemplary preliminary dual damascene feature obtained by performing a process of forming a preliminary dual damascene feature in which the via ESL is not completely removed at the via bottom throughout it; the process comprises a plasma etch process and a stripping process.
Figure 5:
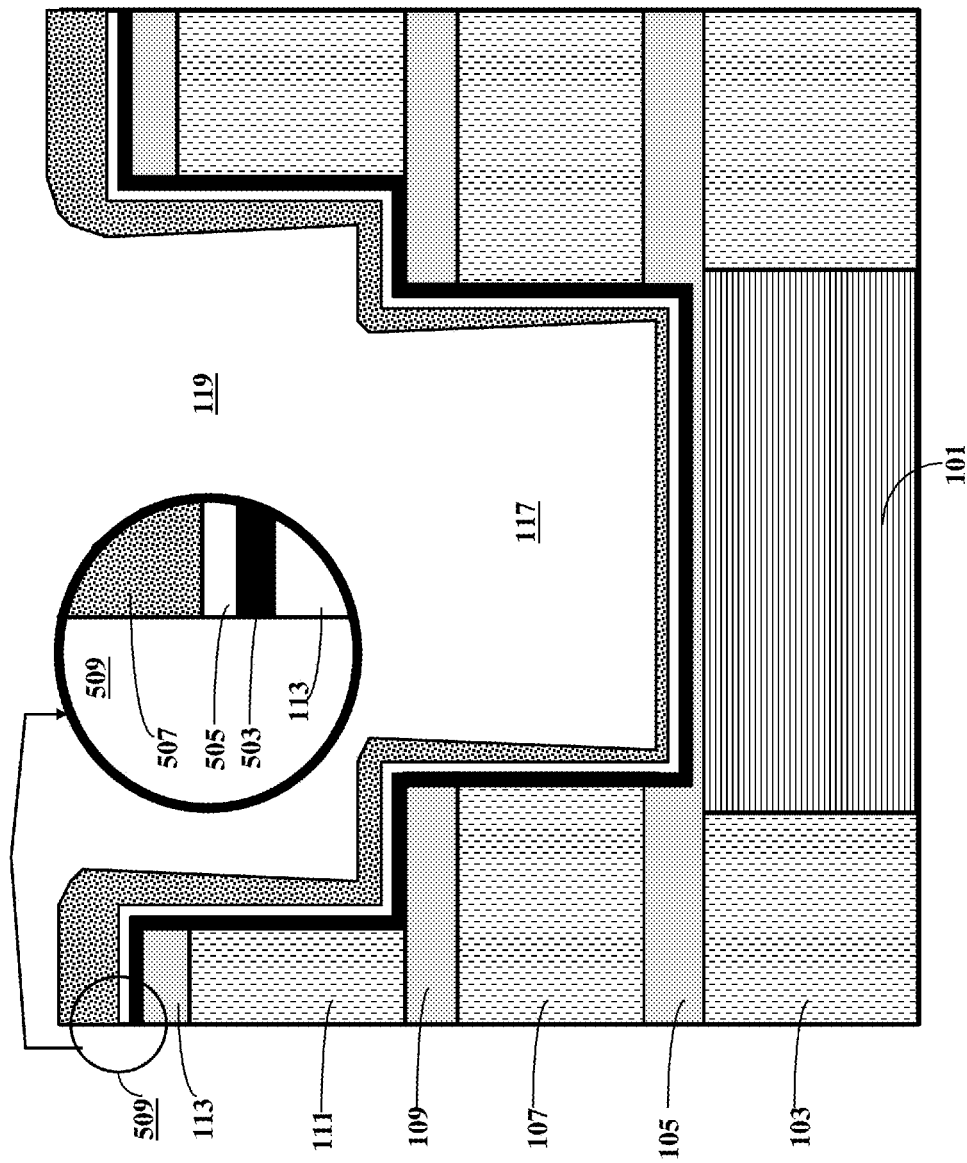
FIG. 5A shows an example of a sacrificial layer that comprises three sub-layers, and is deposited over a damascene feature having a retained via ESL at the via bottom.
FIG. 5B is an illustration of the situation right after the conductor is exposed at the via bottom by an etch back process.
FIG. 5C illustrates how the residue of the etch back process is removed in a residue removal process chemistry through an exemplary selective etching mechanism.
FIG. 5D illustrates a recess 511 formed at the bottom of a landed via hole. Trench sidewalls and via hole sidewalls are covered with remaining sub-layers 503, 505 of the sacrificial layer.
Figure 5:
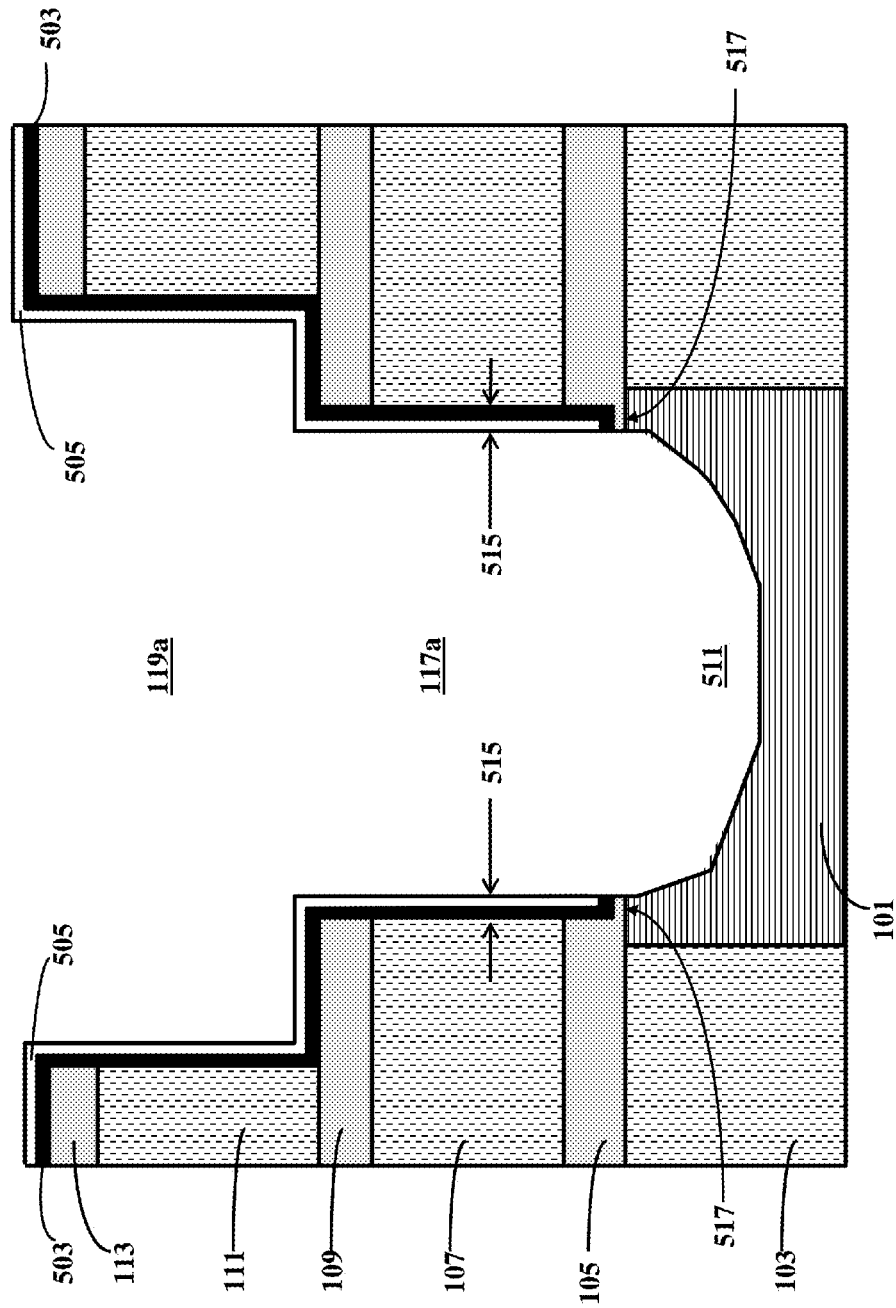
Figure 6:
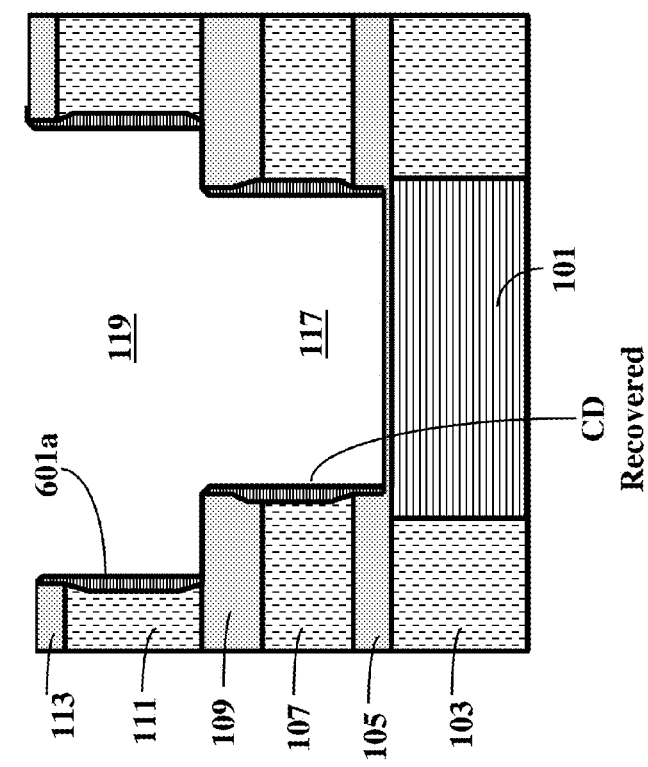
FIG. 6A illustrates a sacrificial layer 601 deposited over a dual damascene feature that suffered a critical dimension loss due to a damage in ILD layers done during the formation of a trench and a via hole.
FIG. 6B illustrates how a sacrificial layer 601 can contribute to the recovery of CD loss through one or more additional etch back processes performed to adjust the conformality of the sacrificial layer.
Figure 6:
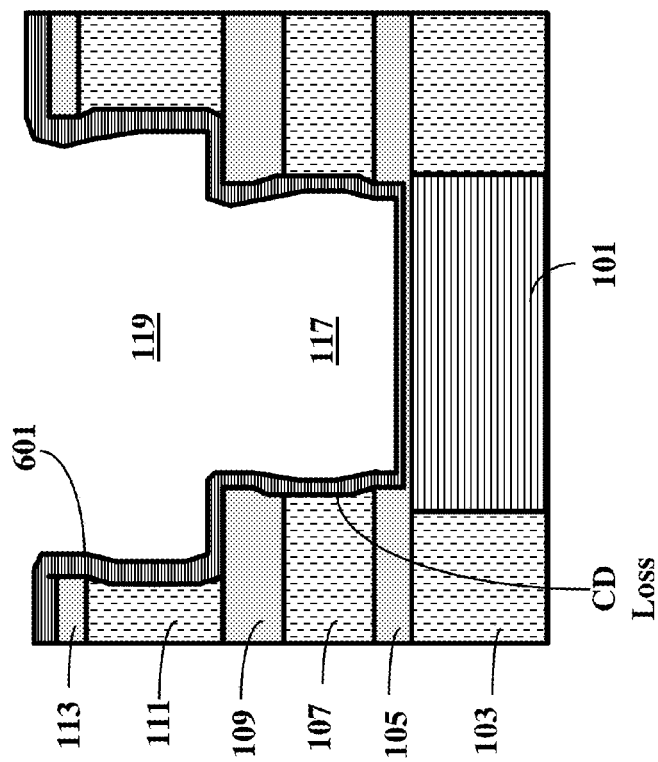

Referring first to FIG. 4, an exemplary preliminary dual damascene feature having a thin portion 401 of the via etch stop layer (via ESL 105) retained at the via bottom after performing the step of etching a preliminary dual damascene feature over a conductor (i.e., lower level conductor) formed in a substrate is illustrated. As shown in this drawing, a composite of multiple dielectric layers is deposited over a substrate having a lower level conductor ($M_x$, x=0 or x>0), which is the uppermost conductor formed in the substrate. The process step of etching a preliminary dual damascene feature etched a preliminary trench 119 and a preliminary via hole 117 that are prepared for forming later an upper level interconnect line ($M_{x+1}$) than $M_x$ and a via ($V_x$), respectively. The preliminary via hole may be etched earlier than the trench is etched, or vice versa. By repeatedly performing the novel damascene process, a multi-level damascene interconnect system can be fabricated.

The process step of etching a preliminary dual damascene feature used for forming the preliminary dual damascene feature is performed in a fashion that at least a portion of the bottom of the preliminary via hole is overlying the lower level conductor. Etching the preliminary dual damascene feature may be performed by using one or more plasma etch processes each of which uses one or more gases selected from a group comprising He, Ar, Xe, Kr, Ne, atomic hydrogen, $H_2$, atomic nitrogen, $N_2$, nitrogen containing compound gases, CO, $CO_2$, atomic oxygen, $O_2$, $O_3$, $H_2O$, hydrocarbon gases, and a major etchant gas group comprising halogen gases, halogen containing compound gases that do not contain a sulfur atom, non-sulfide gases containing a sulfur atom, and sulfide gases.

A sacrificial layer is deposited over the surface of a preliminary damascene feature that is either a contact opening or a dual damascene opening having a contact opening, to primarily protect the dielectric layer constituting the preliminary damascene feature from the contamination or damage or both caused by a process used to expose a conductor at the contact opening bottom. The sacrificial layer is deposited before the conductor at the bottom of the contact opening is exposed in this embodiment. It is to be understood that the aforementioned term 'preliminary damascene feature' indicates a damascene feature, such as a single contact opening and a dual damascene opening, over which a sacrificial layer is deposited before exposing the lower level conductor at the via bottom by using an etch back process step in the embodiment damascene processes of the present invention. The conductor can be exposed with or without forming a recess in the conductor underneath the contact opening bottom. The preliminary damascene feature includes a single damascene via hole (i.e., contact opening) and a dual damascene feature having a via hole. Even after the conductor has been exposed once or more times at the bottom of a via hole (at the via bottom), the sacrificial layer can be deposited over the via hole or over a preliminary damascene feature having the via hole to protect them from further damage or contamination, or both by a subsequent process that will further expose the conductor at the via hole bottom.

The sacrificial layer is a solid material layer at room temperatures that may or may not have pores in it. According to the definition based on the purpose of the sacrificial layer, any material including the one that has been used as a conductive liner layer can be used as a sacrificial layer as long as its primary purpose or use is to protect the dielectric layer such as the ILD layer constituting the damascene feature from the contamination or the damage, or both caused by a subsequent process of exposing the conductor at the bottom of a contact opening. Note that the primary purpose of the conventional conductive liner layer is to block conductor material's diffusion through it to other location or to grab the conductor material to avoid the conductor material's peeling off from it or migrating away from it. Since some conductive liner layers, especially some conductive diffusion barrier layers have been deposited prior to exposing the conductor at the via bottom in prior art fabrication processes for damascene interconnect system having an embedded via (i.e., the punch-through process), further explanations about the difference between the sacrificial layer and the conductive liner layer are provided below.

Unlike the conductive liner layers that are not exposed to the residue removal process, the sacrificial layer is always subject to the residue removal process that removes the residue remaining over the surface of the dielectric layer after the conductor is exposed, or the residue and a portion of or an entire of the sacrificial layer after the conductor is exposed at the bottom of the contact opening. Thus, the exposure of the sacrificial layer to the residue removal process makes the sacrificial layer different from any conductive liner layer used in the present invention or in prior art damascene processes.

Moreover, the fact that the sacrificial layer can be removed thoroughly after its deposition makes it different from the conductive liner layer whose major volume always remains after its deposition till the end of a damascene process that uses it.

If retained after any etch back process used for exposing the conductor, the sacrificial layer further protects the dielectric layer from the environment of the processes subsequent to the etch back process, such as a residue removal process, pre-clean process and the conductive liner layer deposition process.

The sacrificial layer preferably comprises one or more elements selected from a group comprising silicon, oxygen, carbon, nitrogen, hydrogen, fluorine, chlorine, bromine, iodine, boron, phosphor, germanium and arsenic. More preferably, the sacrificial layer consists of either one or more materials selected from the group comprising various silicon compound materials, undoped silicon materials, doped silicon materials, various germanium materials, various germanium compound materials, various carbon materials such as diamond-like carbon (DLC) and diamond, various carbon compound materials, various boron materials, various boron compound materials, various phosphor materials, various phosphor compound materials, arsenic materials, various arsenic compound materials, aromatic hydrocarbon polymers, other organic polymers such as polyimide, organic siloxane polymer, and poly arylene ether.

The group of Si compound materials may include undoped silicon oxides such as SiO and $SiO_2$, doped silicon oxides such as carbon-doped silicate glasses, hydrogen-doped silicon oxide, fluorinated silicon oxides, BSG, PSG, BPSG, organosilicate glasses, various spin-on glasses, spin-on inorganic materials that have chemically bonded Si, spin-on organic materials that have chemically bonded Si, spin-on hybrid materials that have chemically bonded silicon, silicon oxycarbides such as SiOC, silicon oxycarbides that contain hydrogen, silicon nitrides such as SiN and $Si_3N_4$, silicon nitride that contains hydrogen, any silicon oxynitride such as SiON, silicon oxynitrides that contain hydrogen, silicon borides, silicon carbides such as SiC, silicon carbonitrides such as SiCN, silicon carbonitrides that contain hydrogen, silicon oxycarbonitrides such as SiOCN, and silicon oxycarbonitrides with hydrogen such as SiOCNH.

While the conductive liner layer must be electrically conductive, the sacrificial layer does not need to be electrically conductive, as is apparent from the composition of the preferable sacrificial layers. This fact differentiates the sacrificial layer from the conductive liner layer as well.

The sacrificial layer can comprise either a single, uniform material layer, a material layer of gradually changing characteristics in its growth direction, or multiple material layers of varying characteristics. The characteristics comprise crystallographic structure, microstructure, conformality, composition, and material property. Preferably, the sacrificial layer comprises multiple material layers of varying characteristics. Each of the multiple material layers constitutes a sub-layer of the sacrificial layer. The sacrificial layer may be deposited by one or more methods selected from a group comprising a physical vapor deposition method, a chemical deposition (C/D) method, a spray pyrolysis method, electrochemical deposition method, electroless deposition method, and a spin on method. However, it is preferred to deposit the sacrificial layer using a C/D method, such as a plasma enhanced chemical vapor deposition (PECVD) method, and an atomic layer deposition (ALD) method. Note that the chemical deposition (C/D) method is defined as a material layer deposition method using one or more gaseous precursors in this disclosure. Examples of this C/D method include various CVD methods and various ALD methods. This acronym of C/D is different from that of CD that is an abbreviation of critical dimension in this disclosure. In an exemplary embodiment of the present invention, silicon organometallic (MO) gases are used in a C/D system together with porogen-containing precursors to form a sacrificial layer comprising a porous Low k or porous ultra low k (ULK) dielectric material.

One or more dielectric layer pre-treatment processes can be performed prior to the deposition of the sacrificial layer by using one or more pretreatment processes selected from a group comprising a wet clean process, a degas process, a plasma clean process, a densification process and a silylation process. The densification process can be performed by using plasma, electron beam, ion beam, thermal energy, laser energy or photon energy, or any combination thereof. These pre-treatment processes might be needed more if one or more sub-layers of a sacrificial layer are to be retained and incorporated to the final structure of the damascene interconnect system after the residue removal process.

In other embodiment, the sacrificial layer may be deposited over a preliminary damascene feature, such as a preliminary via hole and a preliminary dual damascene feature having a preliminary via hole, that is fabricated by performing a plasma etch process without performing a stripping process so that the sacrificial layer is deposited over a preliminary damascene feature having a post etch residue (PER) on it.

Once the process for exposing the conductor and the residue removal process that removes all the remaining sacrificial layers are performed, the PER can be stripped.

In yet another embodiment, a sacrificial layer may be deposited over a preliminary damascene feature after all of its dielectric layers deposited over the substrate is completely removed at the via bottom by a barrier open process so that the conductor at the via bottom is exposed. Then the process of exposing the conductor is performed to form a recess in the conductor underneath the via bottom through the sacrificial layer so as to form a via that is embedded in the conductor later. For example, the sacrificial layer can be deposited over the prior art damascene feature shown in FIG. 1 in this embodiment, followed by the process of exposing the conductor that forms a recess in the conductor underneath via bottom. By taking this approach, the severe damage or contamination, or both caused by the process of forming a recess to the surface of the dielectric layer, such as the sidewalls of the via hole and the trench, can be prevented, although the damage and the contamination caused by the complete barrier open process is inevitable. This is not a preferred approach; but performing it is still beneficial.

FIG. 5A shows an exemplary sacrificial layer consisting of three sub-layers deposited over the preliminary damascene feature shown in FIG. 4. The first sub-layer 503 of the sacrificial layer may comprise a thin (e.g., less than 10 nm, preferably less than 1 nm) and highly conformal oxide layer such as $SiO_2$ of any quality. This first sub-layer is deposited to protect the vulnerable ILD materials 107, 111 from reducing chemistries such as $SiH_4$ plasma or $NH_3$ plasma that may be needed for the deposition of the second thin sub-layer 505 of the sacrificial layer. Instead of the $SiO_2$ layer for the first sub-layer 503 of the sacrificial layer, any other material layer can be deposited for advantageous merits, such as CD recovery as will be explained.

The second sub-layer is preferably a thin (e.g., less than 10 nm, preferably less than 1 nm) SiN layer of a high conformality so that its thickness can be uniformly decreased in a wet clean chemistry or a plasma clean chemistry used for the residue removal process that is to be performed after completing the etch back process for exposing the lower level conductor at the via bottom. In this preferred embodiment, this second sub-layer of the sacrificial layer is chosen to use its slower etch rate than that of the third sub-layer of the sacrificial layer in the residue removal process chemistry. The preferable deposition method of the first sub-layer comprising the conformal oxide layer 503 and the second sub-layer comprising the SiN 505 can be either ALD or other advanced chemical deposition (C/D) method that is used for material layer growth in a layer-by-layer manner. Note that the remaining via ESL 401 protects the surface of the underlying conductor $M_x$ 101 from the damage and contamination by the deposition processes of the sub-layers of the sacrificial layer.

The third sub-layer 507 is preferably a $SiO_2$ layer deposited by one of many CVD processes including PECVD methods, all of which are the variations of the chemical deposition (C/D) methods. This third sub-layer 507 can have a properly larger thickness on the field area (114 shown in FIG. 4) and the trench bottom (such as location 123 shown in FIG. 4) than that on the via bottom (such as location 401 shown in FIG. 4) so that the materials constituting the field area and the trench bottom of the preliminary damascene feature are protected mostly by the third sub-layer of the sacrificial layer during the etch back process for exposing the conductor at the via bottom. The CVD methods including PECVD methods are preferable deposition methods for the deposition of the third sub-layer since one can deposit a thicker layer on the field and the trench bottom than that on the via bottom area quite easily with them, while avoiding the deposition of extremely overhanging deposits around the trench and via entrances, unlike the cases of its PVD counterparts. Ideally, the third sub-layer 507 shows a faster wet clean rate in a proper isotropic wet clean chemistry than that of the second sub-layer 505 of the sacrificial layer during the residue removal process.

FIG. 5B shows a cross section of the damascene feature that has been shaped during the etch back process for exposing the lower level conductor at the via bottom is completed. In any case, at least the conductor must be exposed by the etch back process used for exposing the lower level conductor. In a landed via case as shown in FIG. 5B, only the lower level conductor is exposed by the etch back process.

In this preferred embodiment, the exposure of the conductor comprises removing all the materials overlying the lower level conductor and a portion of the lower level conductor underneath the via bottom so as to form a recess 511 in the conductor so as to form an embedded via while removing any contamination thoroughly from the top surface of the lower level conductor at the via bottom. In other embodiment, the exposing may remove solely the materials existing over the conductor at the via bottom.

Note that although the etch back process used for exposing the conductor is performed after the deposition of the sacrificial layer in this preferred embodiment, it can be performed during, or during and after the deposition of the sacrificial layer as well in other embodiment.

The residue 513 is formed during the etch back process for exposing the lower level conductor, and is re-deposited on the surface of the remaining sacrificial layer. The residue 513 can comprise various components such as materials of the conductor $M_x$ 101, the elements of via ESL 105, the elements of the sacrificial layer, the elements of ILD 103 (if the via is unlanded like the one shown in FIG. 7A), and the byproducts of the reaction between them and the chemistry of the etch back process. If a sputter etch process is performed using an inert gas plasma for the etch back process, the residue comprises sputtered materials from the material surfaces that are exposed to the conductor-exposing process.

It is illustrated in FIG. 5B that the remaining sub-layers of the original sacrificial layer is protecting the dielectric layer from the residue 513 (which is a contaminant) and the harsh environment of the etch back process used for exposing the conductor. It is also illustrated that the third sub-layer 507 of the sacrificial layer has been protecting the first sub-layer 503 and the second sub-layer 505 of the sacrificial layer efficiently during the etch back process that formed the recess 511, although it has been facetted, and thinned on the field and trench bottom areas.

The etch back process used for exposing at least the lower level conductor is performed by using one or more plasma processes each of which uses one or more gases selected from a group comprising He, Ar, Xe, Kr, Ne, atomic hydrogen, $H_2$, atomic nitrogen, $N_2$, nitrogen containing compound gases, CO, $CO_2$, atomic oxygen, $O_2$, $O_3$, $H_2O$, hydrocarbon gases, and a major etchant gas group consisting of halogen gases, halogen containing compound gases that do not contain a sulfur atom, non-sulfide gases containing a sulfur atom, and sulfide gases. Preferably, the etch back process is performed by a sputter etch using a plasma of one or more inert gases selected from a group comprising He, Ar, Xe, Kr and Ne from a moment right before the materials existing over the conductor is completely etched back.

The depth of the recess 511 formed in the lower level conductor underneath the bottom of the preliminary via hole can be of any value from a depth equivalent to one atomic monolayer of the lower level conductor material to a depth equivalent to 100 percent of the thickness of the conductor. Preferably, the depth of the recess formed in the lower level conductor underneath the via bottom is any value from 5 percent to 50 percent of the thickness of the lower level conductor. The recess is formed for the fabrication of an embedded via.

After the etch back process for exposing the conductor, a residue removal process is carried out by performing a wet clean process or a plasma clean process, or both. The chemistry of the wet clean process preferably comprises one or more chemicals selected from a group comprising $B_2O_3$, $Br_2$, $CH_3COOH$, $Ce(SO_4)_2$, $Ce(SO_3)_3$, $CrO_3$, $CsOH$, $Cu(NO_3)_2$, $FeSO_4$, $FeCl_3$, $Fe(NO_3)_3$, $H_2O$, $H_2O_2$, $H_2N_4$, $H_2SO_4$, $H_3PO_4$, $HNO_3$, $HF$, $H_2S$, $HCl$, $HClO_4$, $HI$, $HBr$, $I_2$, $KI$, $KOH$, $KH_2PO_4$, $KMnO_4$, $KNO_3$, $K_2Fe(CN)_6$, $K_2Cr_2O_7$, $K_3Fe(CN)_6$, $K_4Fe(CN)_6$, $NaOH$, $NaOCl$, $Na_2HPO_4$, $Na_2O$, $Na_2O_2$, $NaNO_2$, $NH_3$, $NH_4F$, $NH_4OH$, $NH_2(CH_2)NH_2$, $N_2H_8C_2$, $NHF$, $N_2H_4$, $(NH_4)_2S_2O_4$, $O_3$, vinylacetate, dipropylenegly-colmonomethyletheracetate, ethylenediamine, ethylenedibromide, ammoniumcitrate, tetramethylammoniumhydroxide, glycerol, ethyleneglycol, oxalic acid dihydrate, anhydrous oxalic acid, citric acid, benzotriazole, propanol, pyrocatechol, polypropyleneglycol, parabenzoquinon, tartaric acid, ethanol, methanol, and isopropanol. The wet clean process can be assisted by an agitation action, vibration action, a heating action or any combination thereof.

The chemistry of the plasma clean process used for the residue removal process comprises one or more gases selected from the group comprising He, Ar, Xe, Kr, Ne, atomic hydrogen, $H_2$, atomic nitrogen, $N_2$, nitrogen containing compound gases, CO, $CO_2$, atomic oxygen, $O_2$, $O_3$, $H_2O$, hydrocarbon gases, and a major etchant gas group consisting of halogen gases, halogen containing compound gases that do not contain a sulfur atom, non-sulfide gases containing a sulfur atom, and sulfide gases.

In an embodiment, the residue removal process removes the residue 513 together with the entire or a part of the sacrificial layer remaining after the etch back process used for exposing the conductor at the via bottom. In another embodiment, the residue removal process removes solely the residue 513 without removing any part of the sacrificial layer that is remaining after the etch back process.

One of the preferred residue removal mechanisms is a lifting off mechanism (i.e., selective etching mechanism) as illustrated in FIG. 5C. Since the byproducts of the etch back process are re-deposited on the third sub-layer (i.e., CVD $SiO_2$), the residue removal process preferably employs any wet etchant that can dissolve the third sub-layer 507 faster than the second sub-layer 505 of the sacrificial layer that comprises SiN. For an example, if a KOH solution is used, the third sub-layer (i.e., CVD $SiO_2$ in this preferred embodiment) may show an etch rate of around 200 A/min, while the etch rate of the second sub-layer (i.e., SiN) may be around 2 A/min. The residue removal process using this KOH solution may need to be continued until the thickness of the SiN layer reduced to a desired thickness (e.g. 0 to 3 Angstrom) to mitigate the adverse influence of this material of relatively high k value on the performance of the microelectronics devices. In this way, the first sub-layer remaining under this retained thin SiN layer (the second sub-layer) can be kept intact (See FIG. 5D) during this preferred residue removal process. Also note that the additional wet clean can be done optionally with a diluted HF (e.g., 100:1 HF) solution to make the removal rate of the second sub-layer (i.e., SiN layer) higher for an improved throughput of residue removal process. By designing the sacrificial layer deposition and the residue removal process appropriately, the sub-layers of the sacrificial layer can be removed selectively or in any other preferable way.

FIG. 5D shows a final dual damascene feature and a recess 511 in the conductor underneath the via bottom both of which are fabricated by using the novel damascene-feature-forming process. This damascene feature comprises a final trench 119a and a final via hole 117a both of which are lined with the remaining sub-layers 503, 505 of the sacrificial layer. By forming this damascene feature by using the present invention, aforementioned problems 1 through 4 of the prior art damascene-feature-forming processes can be avoided.

More specifically, the problem 1 regarding the ILD contamination by conductor materials can be avoided since the dielectric layer is covered by a sacrificial layer during the etch back process performed to expose the conductor. By using a preferred embodiment process in which a conventional plasma etch process is stopped right before the via ESL is etched through, followed by the deposition of a sacrificial layer, and then by the etch back process for exposing the conductor using a sputter etch with an inert gas plasma, problem 2 regarding the contamination and damage to the conductor by halogen- and hydrogen-containing chemistries can be avoided. Since the contamination of the conductor by halogen-containing plasma can be avoided, no prolonged pre-clean that can be harmful for many advanced ILD materials and the conductor is needed prior to the deposition of a conductive liner layer. Moreover, one can use any kind of plasma chemistry (e.g., the oxygen-containing plasma chemistry) that is favorable for feature profile control or for etch rate improvement for a plasma etch process without concerning about the damage and contamination to the conductor until the moment right before the last layer of the via ESL is etched through, thus solving the aforementioned problem 3 of the prior art damascene-feature-forming process. Since the via ESL is finally etched through using an inert gas sputtering during exposing the lower level conductor, there is no chance of forming a stubborn PER such as the conductor-rich polymer in the preferred embodiment process of the present invention, thus solving the problems categorized as problem 4 of the prior art damascene-feature-forming process. Since a recess can be formed in the conductor underneath the via bottom easily by using the preferred embodiment method named the novel damascene-feature-forming process as a preparation step for the fabrication of an embedded via, all the problems related to the damascene interconnects having a planar via (problem 5 through 8) can be solved by the present invention.

Unlike the prior art fabrication method of damascene interconnect having an embedded via (so called a punch-through process) wherein a PVD-grown conductive diffusion barrier of poor initial conformality is damaged by heavily bombarding energetic ions during the formation of a recess in the conductor underneath the via bottom through the diffusion barrier, in this preferred embodiment of the present invention, however, a recess is formed in a lower level conductor before depositing a conductive liner layer over a damascene feature, and after depositing a sacrificial layer having a lot more preferable topological characteristics than those of the PVD grown conductive diffusion barrier layer of the punch-through process, thus avoiding the micro-trench formation and the physical damage to the conductive diffusion barrier layer during the recess formation. The present invention thus provides a solution for the problems categorized as problem 9 of the prior art embedded via formation process (i.e., punch-through process).

Since the highly energetic ion bombardment used for the formation of the recess can agitate various materials underlying a growing or already grown conductive diffusion barrier layer when forming a recess through it in the prior art punch-through process, the conductive diffusion barrier layer is inevitably contaminated by the re-sputtered materials, such as copper, substrate dielectric material, and trench bottom materials. This contamination harms the integrity of the barrier, and that of the subsequently deposited adhesion layer overlying the barrier, leading to a conductor material diffusion problem and adhesion layer mal-function problem. By forming a recess in the conductor before the deposition of the a conductive liner layer, and by removing the contaminants such as the residue with the residue removal process before depositing any conductive liner layer, those problems related to the contamination (e.g., problems 10 and 14) of the conductive liner layer can be avoided.

The faceting problem (i.e., problem 11) may be caused by the prolonged intensive ion bombardment performed over a conductive diffusion barrier layer of a poor conformality when forming a recess in the conductor through a thick bottom barrier layer 301 during the prior art punch-through process. By choosing a proper sacrificial layer having a smallest thickness at the via bottom and less overhang than that of the PVD-grown conductive diffusion barrier layer used in the prior art process, the faceting can be avoided by using the novel damascene-feature-forming process as illustrated in FIG. 5A, FIG. 5B and FIG. 7A.

The non-uniform effect of the etch back process (i.e., problem 12) that may be an intrinsic problem of the prior art punch-through process can also be solved by using the novel damascene-feature-forming process since there are much more choices in choosing a proper sacrificial layer deposition method with which a sacrificial layer showing a lot less aspect ratio dependence of the topological characteristics can be deposited, compared to the PVD-grown conductive diffusion barrier layer used in the prior art process. This is because as the topological characteristics of the sacrificial layer are less variable with a changing aspect ratio of a damascene feature, the less variation there will be in the result of the etch back process used for forming a recess in the conductor. One of the proper deposition methods that can provide a sacrificial layer whose topological characteristics do not change much with a changing aspect ratio of the damascene features is a chemical deposition method, such as an intermittent CVD. The limited choice for a barrier material and its deposition method is a unique problem of the prior art damascene process for fabricating an embedded via that is originated from the fact that a recess in the conductor is formed after depositing a conductive diffusion barrier layer over a damascene feature (i.e., problem 13). Forming the recess by using the novel damascene process is not influenced at all by the characteristics of the conductive diffusion barrier layer, such as the resistance against the re-sputtering and the conformality, since no etch back process is performed to remove a conductive diffusion barrier layer from the via bottom in the formation of a recess in the conductor throughout the novel damascene process, thus providing the solutions for the problems categorized as problem 13. Therefore, the present invention provides an ideal solution for almost every problem found in the prior art damascene processes. More advantageous merits of the present invention will follow.

Even though one can easily completely remove all the sub-layers of a sacrificial layer by modulating their deposition process or residue removal process, it is preferred to retain some of the sub-layers for various advantageous merits.

One of the advantageous merits is the protection provided by the retained sacrificial layer to the dielectric layers, such as the ILD layers. For example, by protecting a ULK ILD from a pre-clean process that uses reducing plasma, the overall dielectric constant of a IC device can be reduced.

Another advantageous merit is the capability of CD recovery by using a retained sacrificial layer, as will be described in conjunction with FIG. 6A and FIG. 6B.

For the realization of this CD recovery, an additional etch back process may need to be performed to adjust the conformality of one or more sub-layers of a sacrificial layer after their deposition, and prior to the etch back process for exposing the conductor.

The additional etch back process for adjusting the conformality of the sacrificial layer comprises one or more processes selected from a group comprising anisotropic plasma etch processes and isotropic plasma etch processes. Preferably, the additional etch back process comprises at least one anisotropic plasma process using at least one gas selected from the group comprising He, Ar, Xe, Kr, Ne, atomic hydrogen, $H_2$, atomic nitrogen, $N_2$, nitrogen containing compound gases, CO, $CO_2$, atomic oxygen, $O_2$, $O_3$, $H_2O$, hydrocarbon gases, and a major etchant gas group consisting of halogen gases, halogen containing compound gases that do not contain a sulfur atom, non-sulfide gases containing a sulfur atom, and sulfide gases.

This conformality adjustment can also be useful in improving the outcome of the etch back process for exposing the conductor, since this etch back process can be adversely influenced by the topological characteristics of a sacrificial layer, if it has a poor conformality.

FIGS. 6A and B illustrates how a sacrificial layer 601 whose conformality has been adjusted by the additional etch back process can contribute to the recovery of CD loss. FIG. 6A. shows a sacrificial layer deposited over the damaged sidewalls of a via hole and a trench. This sacrificial layer 601 preferably comprises a low K or ULK dielectric layer material. By performing an additional etch back process, the CD loss has been recovered as shown in FIG. 6B by the remaining portion of the sacrificial layer 601a.

The next step of the novel damascene process after the residue removal process is a conductive liner layer deposition step, wherein one or more conductive liner layers is deposited over the final dual damascene feature and the surface of the lower level conductor exposed at the bottom of the final via hole. Also, the lower level conductor exposed at the bottom of the final via hole may have either a recess or no recess. Each of the one or more conductive liner layers comprises either a conductive diffusion barrier layer or an adhesion layer, or both. In a preferred embodiment, the conductive liner layer comprises a conductive diffusion barrier layer underlying an adhesion layer.

The conductive liner layer used in this invention can comprise one or more materials selected from a group consisting of tantalum of any phase (Ta), tantalum nitride of a low nitrogen concentration ($TaN_x$, $0<x\leq0.1$), tantalum nitride of a high nitrogen concentration ($TaN_y$, $y>0.1$), tantalum boride of a low boron concentration ($TaB_x$, $0<x\leq0.1$), tantalum boride of a high boron concentration ($TaB_y$, $y>0.1$), tantalum carbide of a low carbon concentration ($TaC_x$, $0<x\leq0.1$), tantalum carbide of a high carbon concentration ($TaC_y$, $y>0.1$), tantalum carbonitride of any carbon and nitrogen concentration (TaCN), tantalum silicon nitride of any silicon and nitrogen concentration (TaSiN), tungsten of any phase (W), tungsten nitride of a low nitrogen concentration ($WN_x$, $0<x\leq0.1$), tungsten nitride of a high nitrogen concentration ($WN_y$, $y>0.1$), tungsten carbide of a low carbon concentration ($WC_x$, $0<x\leq0.1$), tungsten carbide of a high carbon concentration ($WC_y$, $y>0.1$), tungsten carbonitride of any carbon and nitrogen concentration (WCN), tungsten silicon nitride of any silicon and nitrogen concentration (WSiN), titanium of any phase (Ti), titanium nitride of a low nitrogen concentration ($TiN_x$, $0<x\leq0.1$), titanium nitride of a high nitrogen concentration ($TiN_y$, $y>0.1$), titanium silicon nitride of any silicon and nitrogen concentration (TiSiN), titanium carbide of a low carbon concentration ($TiC_x$, $0<x\leq0.1$), titanium carbide of a high carbon concentration ($TiC_y$, $y>0.1$), titanium carbonitride of any carbon and nitrogen concentration (TiCN), ruthenium of any phase (Ru), Ru oxide of a low oxygen concentration ($RuO_x$, $0<x\leq0.1$), Ru oxide of a high oxygen concentration ($RuO_y$, $y>0.1$), Ru nitride of a low nitrogen concentration ($RuN_x$, $0<x\leq0.1$), Ru nitride of a high nitrogen concentration ($RuN_y$, $y>0.1$), Ru carbide of a low carbon concentration ($RuC_x$, $0<x\leq0.1$), Ru carbonitride of any carbon and nitrogen concentration (RuCN), cobalt of any phase (Co), chromium of any phase (Cr), chromium nitride of a low nitrogen concentration ($CrN_x$, $0<x\leq0.1$), chromium carbide of a low carbon concentration ($CrC_x$, $0<x\leq0.1$), chromium carbonitride of any phase (CrCN), nickel of any phase (Ni), rhenium of any phase (Re), platinum of any phase (Pt), silver of any phase (Ag), gold of any phase (Au), iridium of any phase (Ir), osmium of any phase (Os), rhodium of any phase (Rh), palladium of any phase (Pd), molybdenum of any phase (Mo), molybdenum carbide of a low carbon concentration ($MoC_x$, $0<x\leq0.1$), molybdenum nitride of a low nitrogen concentration ($MoN_x$, $0<x\leq0.1$), molybdenum carbonitride of any carbon and nitrogen concentration (MoCN), niobium of any phase (Nb), vanadium of any phase (V), vanadium carbide of a low carbon concentration ($VC_x$, $0<x\leq0.1$), vanadium nitride of a low nitrogen concentration ($VN_x$, $0<x\leq0.1$), vanadium carbonitride of any carbon and nitrogen concentration (VCN), iron of any phase (Fe), zirconium of any phase (Zr), lanthanum of any phase (La), thallium of any phase (Tl) and hafnium of any phase (Hf).

Prior to the deposition of the conductive liner layer, either a degas process or pre-clean process, or both can be performed. Since no stubborn organometallic polymer has been formed during the novel damascene-feature-forming process of the present invention, only a light pre-clean may be needed. If the surface of the dielectric layer has been pre-treated with a degas process prior to the deposition of the sub-layer of a sacrificial layer comprising SiO2 503, no prolonged degas is needed prior to the deposition of the conductive liner layer since the surface has been sealed by the retained sub-layer of a sacrificial layer 503.

FIG. 7A illustrates the preferred embodiment, wherein a conductive diffusion barrier layer 701 is deposited over the surface of a final dual damascene feature and the surface of the recess 511. The damascene feature shown in FIG. 7A does not have the high K sacrificial layer comprising SiN 505. Also, the via hole of the damascene feature is unlanded.

The conductive diffusion barrier layer 701 shown in FIG. 7A preferably comprises a tantalum carbonitride (TaNC) layer deposited by a plasma enhanced C/D method that uses a plasma of one or more nitrogen-containing Ta organometallic (MO) gases. This conductive diffusion barrier layer is preferably deposited by using a cyclic and sequential plasma enhanced C/D process, such as a plasma enhanced intermittent CVD method in which a cyclic and sequential precursor delivery, layer deposition, and impurity removal from the deposited material layer are performed. The thickness of the conductive diffusion barrier layer is less than 2 nm. The reason why the diffusion barrier can be this thin is because the conductive diffusion barrier layer has its highest integrity for it has not been physically damaged or contaminated by the conductor material during the novel damascene-feature-forming process.

Figure 7B:
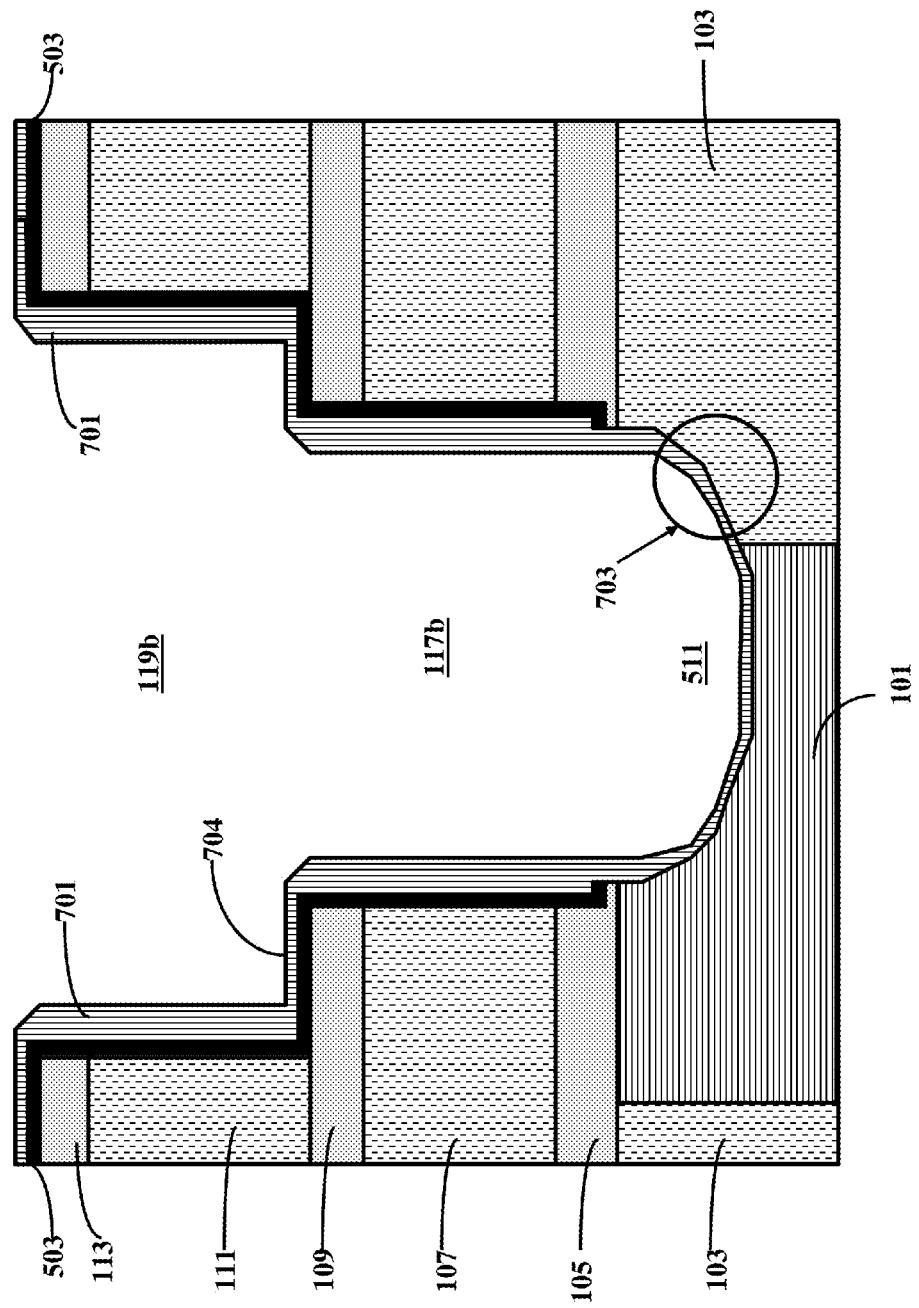
FIG. 7B shows a thinned conductive diffusion barrier 701 by a liner etch back process at the via bottom.

In an embodiment, one or more liner etch back processes during or after, or during and after the deposition of the one or more conductive liner layers can be performed, thereby the conformality of the conductive liner layers is adjusted at least one time prior to filling the damascene feature with an upper level conductor. FIG. 7B illustrates the preferred embodiment, wherein the conductive diffusion barrier layer 701 is etched back by one or more liner etch back processes for a conformality adjustment purpose. Thinning the barrier at the via bottom can decrease a via resistance. However, too small a thickness can cause a free diffusion of upper level conductor material through the barrier from level to level, thus causing void formation in the conductor material constituting the interconnect system. Also, the thin barrier thickness can cause the conductor material to diffuse to the substrate dielectric layer 103 through the thin spot 703. The thickness of the diffusion barrier layer at the trench bottom 704 is preferably controlled to its optimum value to avoid a conductor material diffusion through there.

In another preferred embodiment, one conductive liner layer comprising $TaN_x$ ($1<x\leq0.1$) material is deposited. The thickness of this one conductive liner layer comprising the $TaN_x$ material is preferably about 3 nm or less. Preferably, the nitrogen concentration of the one conductive liner layer comprising $TaN_x$ material is unevenly distributed throughout the thickness of it, so that the concentration of the nitrogen is higher on the side of the layer that is contacting the surface of the final dual damascene feature than that on the opposite side of the layer.

Once a proper conductive diffusion barrier is deposited, an adhesion layer 705 can be deposited over it, as shown in FIG. 7C. In a preferred embodiment, a Ta or $TaN_x$ layer can be deposited as the adhesion layer by using the PEALD or other C/D method using one of the Ta halide gases, together with hydrogen and Ar gases. In another preferred embodiment, the adhesion layer 705 can be deposited via a PVD Ta process, together with the liner etch back process performed during or after, or during and after the adhesion layer deposition for the purpose of adjusting the Ta layer's conformality. If the conductive diffusion barrier comprises a TaNC material of high bonding force, this liner etch back process can be carried out without damaging the TaNC layer because of the high bonding force.

Figure 7D:
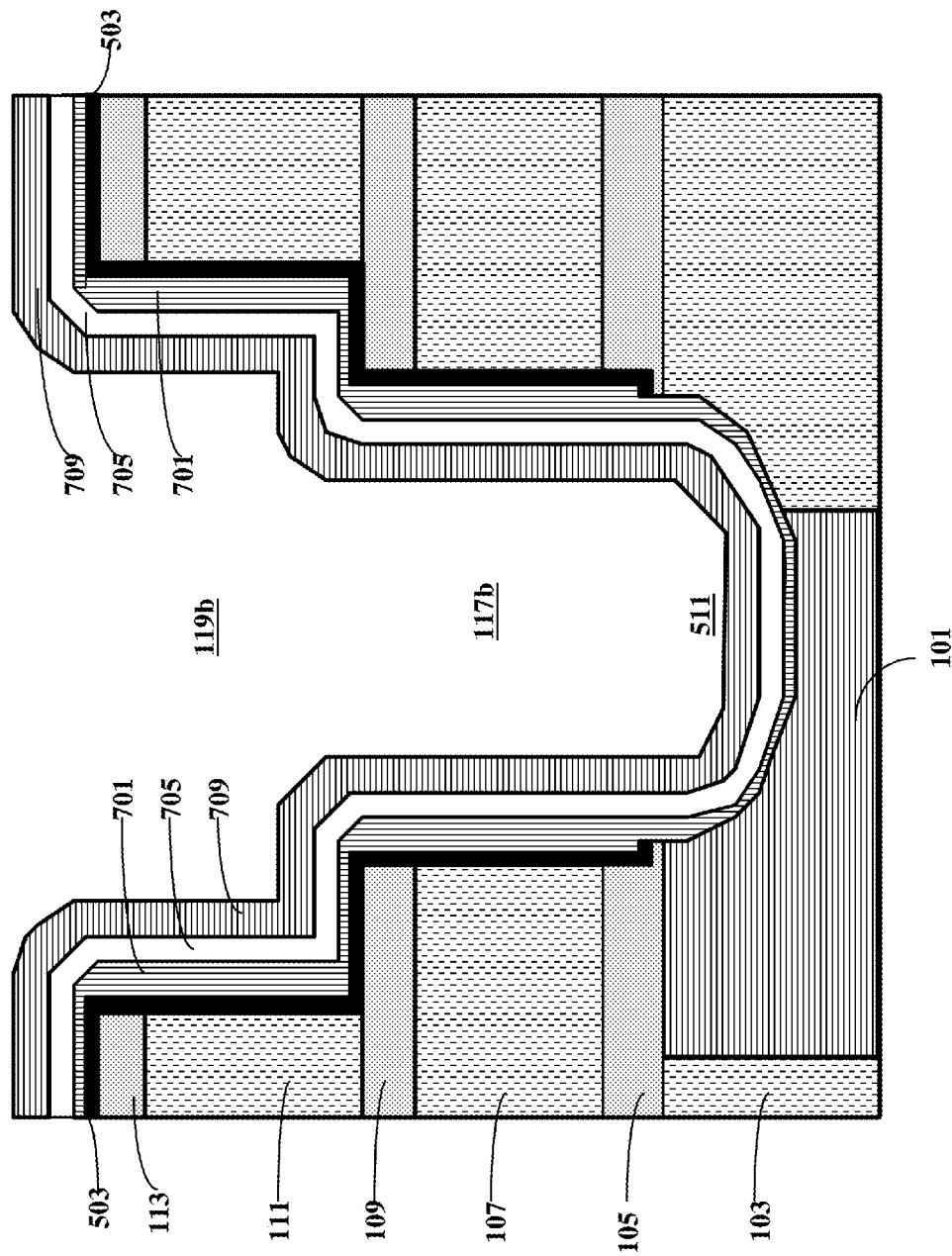
FIG. 7D shows an exemplary seed layer 709 that has been deposited by a PVD method over the adhesion layer; a seed etch back process was performed for its conformality adjustment purpose.

As illustrated in FIG. 7D, a seed layer 709 is then deposited to provide a seed for an ease of subsequent electrochemical deposition (ECD) copper fill process. The seed layer deposition method is selected from a group comprising chemical deposition (C/D) methods, physical vapor deposition (PVD) methods and electrochemical deposition (ECD) methods. This seed layer may be deposited together with a seed etch back process for adjusting the conformality of it during or after, or during and after its deposition process by using at least one kind of energized and ionized gases, such as accelerated Ar ions. This seed layer deposition is a part of the process of filling an upper level conductor.

The upper level conductor used to fill the final dual damascene feature and the recess may comprise one or more conductor materials selected from a group comprising carbon such as carbon nanotube, pure metal materials such as copper and tungsten, metal alloys such as copper alloys and aluminum alloys, metal silicides such as nickel silicide, metal oxides such as tin dioxide, metal nitrides such as tantalum nitride, metal carbides such as TaC, metal borides such as $TiB_2$, metal carbonitrides such as TaCN, and doped silicons.

Figure 7E:
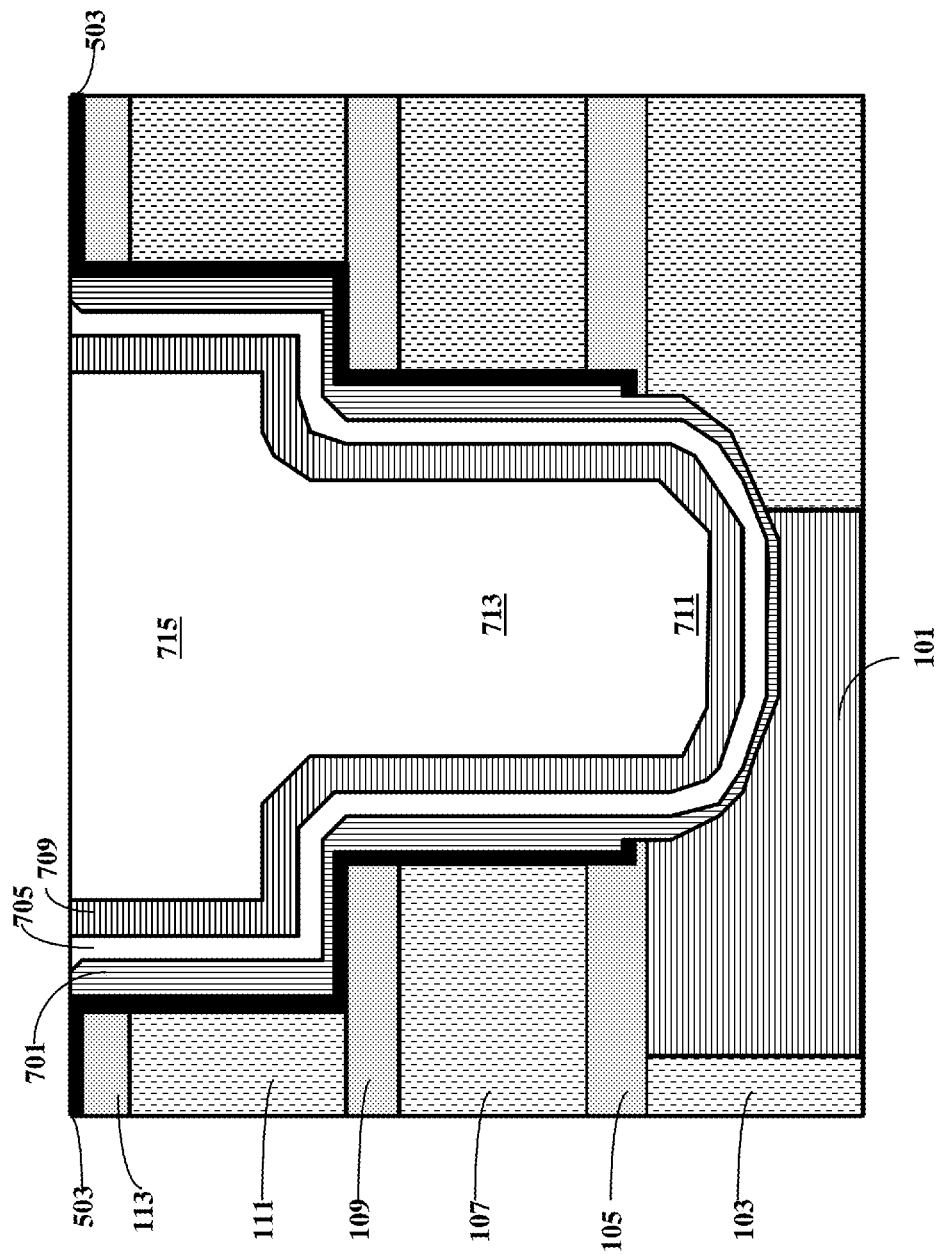
FIG. 7E illustrates a dual damascene interconnect system formed after performing a planarization step.

After filling the damascene feature with the upper level conductor, a process of planarizing the top surface of the upper level conductor is preferably performed by a chemical mechanical polishing method. By planarizing the top surface of the upper level conductor, an upper level interconnect line than the lower level conductor is formed over a via that is preferably embedded in the lower level conductor. FIG. 7E illustrates a dual damascene interconnect system formed after performing the planarization. The interconnect system comprises a via $V_x$ 713 having an embedded portion 711 and the upper level interconnect line $M_{x+1}$ 715. A portion of a sacrificial layer 503 is incorporated in the interconnect system.

Figure 8:
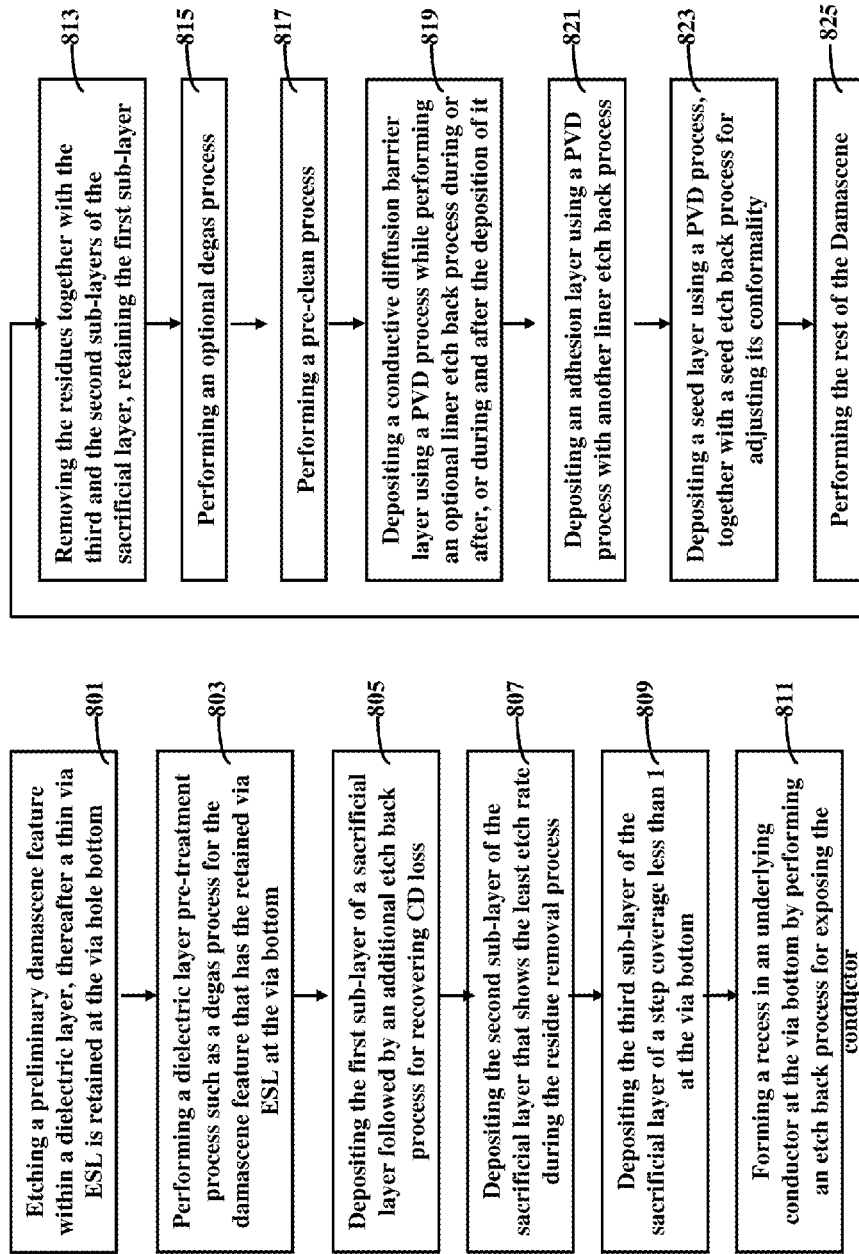
FIG. 8 is an example of a damascene process flow used for the manufacture of damascene interconnects with an embedded via after recovering CD loss, according to an embodiment of the present invention.

FIG. 8 shows another exemplary flow of a damascene process used for the manufacture of damascene interconnects with an embedded via by using a sacrificial layer comprising three sub-layers, while recovering CD loss, avoiding material damage or contamination, or both, and improving device performances. In this exemplary embodiment, a preliminary damascene feature having a thin via ESL retained over the already existing lower level conductor, $M_x$, at the via bottom is formed by using the step of etching a preliminary dual damascene feature, preventing the damascene feature and the conductor from contamination or damage, or both (see step 801). A degas process, which is one of the aforementioned dielectric layer pre-treatment processes is then performed on the substrate having the damascene feature to remove volatile impurities from it (see step 803). The retained via ESL protects the lower level conductor $M_x$ from damages or contamination, or both during this degas process and subsequent sacrificial layer deposition process. Other dielectric layer pre-treatment process can be performed to seal pores or to repair damages in the ILD materials that constitute the preliminary damascene feature, followed by the deposition of the first sub-layer of the sacrificial layer (see step 805). The first sub-layer comprises one or more ULK materials. An additional etch back process is performed over the first sub-layer of the sacrificial layer during or after its deposition process to remove unnecessary portion of it, thus recovering the CD loss of the damascene feature (see step 805). Then, the second sub-layer of the sacrificial layer that shows the least etch rate among the three sub-layers of the sacrificial layer during the residue removal process (see step 813) is formed (see step 807). Due to the second sub-layer's smallest etch rate relative to other sub-layers, any remaining residue of the etch back process used for exposing the conductor, and the third sub-layer of the sacrificial layer can be removed thoroughly. This second sub-layer can be removed in a stable manner as well due to its small etch rate. The third sub-layer of the sacrificial layer (see step 809) has a step coverage of less than one, and preferably less than 0.5 at the via bottom so that it can be etched back earlier at the via bottom than at the field and trench bottom area during the subsequent etch back process used for exposing the conductor (see step 811) after which a recess is formed in the conductor. In this way, one can form a recess in the conductor preferentially at the via bottom, while protecting the field area and the trench bottom of the damascene feature. Upon completing the etch back process and the residue removal process (see step 813), an optional degas process (see step 815) and a pre-clean process (see step 817) are then performed, prior to the deposition of a conductive liner layer (see step 819 and 821), which comprises a conductive diffusion barrier and an adhesion layer in this exemplary embodiment of the present invention. During or after, or during and after its deposition process, the conductive liner layer can be etched back by the liner etch back process (see step 819 and 821) for thickness adjustment. A seed layer is then deposited over the conductive liner layer, together with a seed etch back process during or after, or during and after its deposition process in a PVD chamber (see step 823). By performing the rest of the damascene process, such as ECD Cu and CMP, a new damascene interconnect system having an embedded via $V_x$ and an upper level conductor $M_{x+1}$ both of which are covered by the conductive liner layer is fabricated (see step 825). By repeating the processes shown in FIG. 8 together with other damascene process steps, such as photoresist deposition and lithography steps, a multilevel damascene interconnect system of a high performance can be fabricated at a high yield and a low cost.

While providing various advantages as have been explained in this disclosure, the present invention may reduce the cross-sectional areas of conduction channels since the sacrificial layer may decrease critical dimensions (CDs) of a damascene interconnect system, or block the conductor-cleaning activities, such as the etch back process used for exposing the conductor at the via bottom.

If retained and incorporated into the damascene interconnect system, a sacrificial layer may decrease a critical dimension (CD), such as a width of an upper level conductor line and a via diameter, to a smaller value than the CD that could have been obtained by using a prior art damascene process in which the formation of an upper level conductor in a damascene feature is performed without depositing a sacrificial layer over it. In this disclosure, the CD that is obtained by a prior art damascene process without using any sacrificial layer is referred to as a "target CD." The target CD includes a target line width and a target via diameter, all of which are determined based upon the performances required to a final damascene interconnect system. Assuming that the damascene feature shown in FIG. 1 is fabricated to form a damascene interconnect system having an upper level conductor line of a target line width, and a via of a target via diameter, if a conductive liner layer and an upper level conductor are deposited over the damascene feature shown in FIG. 1 without depositing any sacrificial layer over it, the trench width 127 and the via hole diameter 129 of the damascene feature determine the target line width and the target via diameter of the damascene interconnect system, respectively. However, if an embodiment damascene process of the present invention in which a sacrificial layer is deposited and at least a part of it is incorporated into a damascene interconnect system is applied over the damascene feature shown in FIG. 1, the line width and the via diameter of an embodiment damascene interconnect system fabricated using the embodiment process will be smaller than the target line width 127 and the target via diameter 129, respectively. Assuming that the thicknesses of a sacrificial layer that is retained over the sidewall of a trench and a via hole of the damascene feature shown in FIG. 1 are Tt and Tv, respectively, and also assuming that the retained sacrificial layer is eventually incorporated into a damascene interconnect system fabricated by using the embodiment damascene process of the present invention, the CD of the upper level conductor line and the CD of the via diameter of this embodiment damascene interconnect system would be smaller than the target line width 127 and the target via diameter 129 by 2 times Tt and 2 times Tv, respectively. The decreased CDs of line width and via diameter can cause a reduced conduction channel, which decreases signal propagation speed.

Moreover, if any sacrificial layer remains on the sidewall of a preliminary via hole during any process that helps reduce the contact resistance, the sacrificial layer may block the beneficial effect of the process. For example, if a sacrificial layer exists during an etch back process for exposing the conductor at the via bottom, the sacrificial layer can block the conductor-cleaning activity of the etch back process. More specifically, the area 517 (see FIG. 5D) of the top surface of the lower level conductor 101 that is shadowed by the sacrificial layer having a thickness 515 cannot be cleaned by the etch back process used for exposing the conductor, thus narrowing the conduction channel between a via that is to be formed in the via opening 117a, and the lower level conductor 101 of a damascene interconnect system.

One solution for the aforementioned problems of reduced conduction channel caused by the sacrificial layer is to decrease its thickness. Removing the sacrificial layer thoroughly after its primary role is accomplished so as not to retain it in an embodiment damascene interconnect system would be another solution for the problems. The other solution for the problems is to use a preliminary damascene opening that has sufficiently large feature CDs to compensate for the decreased CD caused by the sacrificial layer. For example, if one wants to form an embodiment damascene interconnect system having an integrated sacrificial layer whose thicknesses on the trench sidewall and the via hole sidewall are Tt and Tv, respectively, while allowing the damascene interconnect system to have a target line width and a target via diameter, one can deposit a sacrificial layer over a preliminary damascene feature (i.e., preliminary damascene opening) having a larger trench width and a larger via hole diameter than the target line width and the target via diameter by 2 times Tt and 2 times Tv, respectively. In this way, the actual line width and the via diameter can become the target line width and the target via diameter, even if the sacrificial layer were incorporated in the embodiment damascene interconnect system. Also, the conduction channel reduction problem caused by the shadowing effect of the sacrificial layer acting against the conductor-cleaning activity of any process such as the etch back process can be solved or mitigated as well by adopting the preliminary damascene feature having the larger trench width and the via hole diameter than the target CD counterparts.

The invention claimed is:

1. A method for fabricating an interconnect system, comprising:
   a. depositing a dielectric layer over a substrate, said substrate having formed therein a conductor of a selected thickness;
   b. etching a preliminary contact opening in said dielectric layer over said conductor;
   c. depositing a sacrificial layer over the surface of a sidewall of said preliminary contact opening;
   d. with said sacrificial layer protecting said sidewall of said preliminary contact opening, forming a recess in said conductor at the bottom of said preliminary contact opening by performing an etch back process; and
   e. performing a residue removal process to remove at least a portion of said sacrificial layer and residue resulting from said etch back process to form a final contact opening.

2. The method of claim 1, wherein said dielectric layer comprises a composite of multiple dielectric layers.

3. The method of claim 2, wherein said composite of multiple dielectric layers comprises one or more interlevel dielectric (ILD) layers and one or more other dielectric layers than said interlevel dielectric layers.

4. The method of claim 3, wherein said one or more other dielectric layers are each selected from a group consisting of a capping layer, a dielectric diffusion barrier layer, a passivation layer, and a chemical mechanical polishing (CMP) stop layer.

5. The method of claim 1, wherein said etching a preliminary contact opening is performed by a plasma etch process using one or more gases selected from a group consisting of He, Ar, Xe, Kr, Ne, atomic hydrogen, $H_2$, atomic nitrogen, $N_2$, nitrogen containing compound gases, CO, $CO_2$, atomic oxygen, $O_2$, $O_3$, $H_2O$, hydrocarbon gases, and a major etchant gas group consisting of halogen gases, halogen containing compound gases that do not contain a sulfur atom, non-sulfide gases containing a sulfur atom, and sulfide gases.

6. The method of claim 1, wherein said etching a preliminary contact opening stops before said conductor is exposed, thereby a portion of said dielectric layer is retained over said conductor at the bottom of said preliminary contact opening.

7. The method of claim 1, wherein said etching a preliminary contact opening is continued until said dielectric layer deposited over said conductor is etched through at the bottom of said preliminary contact opening.

8. The method of claim 1, wherein said sacrificial layer is a solid material layer at room temperatures.

9. The method of claim 8, wherein said sacrificial layer comprises one or more elements selected from a group consisting of silicon, oxygen, carbon, nitrogen, hydrogen, fluorine, chlorine, bromine, iodine, boron, phosphor, germanium, and arsenic.

10. The method of claim 8, wherein said sacrificial layer comprises either a single material layer of constant characteristics, a material layer of gradually changing characteristics in its growth direction, or multiple material layers of varying characteristics, each of said characteristics being selected from a group consisting of crystallographic structure, microstructure, conformality, composition, and material property.

11. The method of claim 1, wherein said sacrificial layer is deposited using one or more methods selected from a group consisting of physical vapor deposition methods, chemical deposition methods, spray pyrolysis methods, electrochemical deposition methods, electroless deposition methods, and spin on methods.

12. The method of claim 1, wherein said sacrificial layer is deposited using one or more chemical deposition methods.

13. The method of claim 1, further comprising, performing an additional etch back process for adjusting the conformality of said sacrificial layer prior to said forming a recess.

14. The method of claim 1, further comprising, pretreating said dielectric layer prior to said depositing a sacrificial layer using one or more dielectric layer pretreatment processes selected from a group consisting of wet clean processes, degas processes, plasma clean processes, densification processes, and silylation processes.

15. The method of claim 1, wherein said etch back process is performed by using one or more plasma processes each of which uses one or more gases selected from a group consisting of He, Ar, Xe, Kr, Ne, atomic hydrogen, $H_2$, atomic nitrogen, $N_2$, nitrogen containing compound gases, CO, $CO_2$, atomic oxygen, $O_2$, $O_3$, $H_2O$, hydrocarbon gases, and a major etchant gas group consisting of halogen gases, halogen containing compound gases that do not contain a sulfur atom, non-sulfide gases containing a sulfur atom, and sulfide gases.

16. The method of claim 1, wherein said etch back process is performed using a sputter etch in a plasma of one or more inert gases selected from a group consisting of He, Ar, Xe, Kr and Ne.

17. The method of claim 1, wherein said etch back process is continued after the materials existing over said conductor at the bottom of said preliminary contact opening is removed, thereby forming said recess in said conductor.

18. The method of claim 17, wherein the depth of said recess ranges from one atomic monolayer of said conductor to said selected thickness.

19. The method of claim 17, wherein the depth of said recess ranges from 5 percent to 50 percent of said selected thickness.

20. The method of claim 1, wherein said residue removal process is carried out by performing a wet clean process or a plasma clean process, or both.

21. The method of claim 20, wherein said wet clean process uses one or more chemicals selected from a group consisting of $B_2O_3$, $Br_2$, $CH_3COOH$, $Ce(SO4)2$, $Ce(SO3)3$, $CrO_3$, CsOH, $Cu(NO_3)_2$, $FeSO_4$, $FeCl_3$, $Fe(NO_3)_3$, $H_2O$, $H_2O_2$, $H_2N_4$, $H_2SO_4$, $H_3PO_4$, $HNO_3$, HF, $H_2S$, HCl, $HClO_4$, HI, HBr, $I_2$, KI, KOH, $KH_2PO_4$, $KMnO_4$, $KNO_3$, $K_2Fe(CN)_6$, $K_2Cr_2O_7$, $K_3Fe(CN)_6$, $K_4Fe(CN)_6$, NaOH, NaOCl, $Na_2HPO_4$, $Na_2O$, $Na_2O_2$, $NaNO_2$, $NH_3$, $NH_4F$, $NH_4OH$, $NH_2(CH_2)NH_2$, $N_2H_8C_2$, NHF, $N_2H_4$, $(NH_4)_2S_2O_4$, $O_3$, vinylacetate, dipropyleneglycolmonomethyletheracetate, ethylenediamine, ethylenedibromide, ammoniumcitrate, tetramethylammoniumhydroxide, glycerol, ethyleneglycol, oxalic acid dihydrate, anhydrous oxalic acid, citric acid, benzotriazole, propanol, pyrocatechol, polypropyleneglycol, parabenzoquinon, tartaric acid, ethanol, methanol, and isopropanol.

22. The method of claim 20, wherein said plasma clean process uses one or more gases selected from a group consisting of He, Ar, Xe, Kr, Ne, atomic hydrogen, $H_2$, atomic nitrogen, $N_2$, nitrogen containing compound gases, CO, $CO_2$, atomic oxygen, $O_2$, $O_3$, $H_2O$, hydrocarbon gases, and a major etchant gas group consisting of halogen gases, halogen containing compound gases that do not contain a sulfur atom, non-sulfide gases containing a sulfur atom, and sulfide gases.

23. The method of claim 1, wherein said sacrificial layer is deposited over a preliminary contact opening having a post etch residue remaining thereon.

24. The method of claim 1, further comprising, forming a preliminary trench over said preliminary contact opening before said depositing a sacrificial layer.

25. The method of claim 1, further comprising,
   a. depositing a conductive liner layer over the surface of said final contact opening and the surface of said conductor in said recess;
   b. filling said final contact opening and said recess that are lined with said conductive liner layer with an upper level conductor; and
   c. planarizing said upper level conductor, thereby forming a single damascene contact.

26. The method of claim 25, wherein said upper level conductor comprises one or more conductor materials selected from a group consisting of carbon, pure metal materials, metal alloys, metal silicides, metal oxides, metal nitrides, metal carbides, metal borides, metal carbonitrides, and doped silicons.

27. A method for fabricating a dual damascene interconnect system, comprising:
   a. depositing a dielectric layer over a substrate having formed therein a lower level conductor of a selected thickness;
   b. etching a preliminary dual damascene feature in said dielectric layer, said preliminary dual damascene feature comprising a preliminary trench and a preliminary via hole, said preliminary via hole underlying said preliminary trench;
   c. depositing a sacrificial layer over the surface of a side wall of said preliminary dual damascene feature;
   d. with said sacrificial layer protecting said sidewall of said preliminary contact opening, forming a recess in said lower level conductor at the bottom of said preliminary via hole by performing an etch back process; and
   e. performing a residue removal process to remove at least a portion of said sacrificial layer and residue resulting from said etch back process, so as to form a final dual damascene feature comprising a final trench and a final via hole.

28. The method of claim 27, wherein said dielectric layer comprises a composite of multiple dielectric layers.

29. The method of claim 28, wherein said composite of multiple dielectric layers comprises one or more interlevel dielectric (ILD) layers and one or more other dielectric layers than said interlevel dielectric layers.

30. The method of claim 29, wherein said one or more other dielectric layers are each selected from a group consisting of capping layers, dielectric diffusion barrier layers, passivation layers, chemical mechanical polishing (CMP) stop layers, and etch stop layers.

31. The method of claim 27, wherein said etching a preliminary dual damascene feature is performed by one or more plasma etch processes using one or more gases selected from a group consisting of He, Ar, Xe, Kr, Ne, atomic hydrogen, $H_2$, atomic nitrogen, $N_2$, nitrogen containing compound gases, CO, $CO_2$, atomic oxygen, $O_2$, $O_3$, $H_2O$, hydrocarbon gases, and a major etchant gas group consisting of halogen gases, halogen containing compound gases that do not contain a sulfur atom, non-sulfide gases containing a sulfur atom, and sulfide gases.

32. The method of claim 27, wherein said etching a preliminary dual damascene feature stops before said dielectric layer deposited over said lower level conductor is etched through at the bottom of said preliminary via hole.

33. The method of claim 27, wherein said etching a preliminary dual damascene feature is continued until said dielectric layer deposited over said lower level conductor is etched through at the bottom of said preliminary via hole.

34. The method of claim 27, wherein said sacrificial layer is a solid material layer at room temperatures.

35. The method of claim 27, wherein said sacrificial layer comprises one or more elements selected from a group consisting of silicon, oxygen, carbon, nitrogen, hydrogen, fluorine, chlorine, bromine, iodine, boron, phosphor, germanium and arsenic.

36. The method of claim 27, wherein said sacrificial layer comprises either a single material layer of constant characteristics, a material layer of gradually changing characteristics in its growth direction, or multiple material layers of varying characteristics, each of said characteristics being selected from a group consisting of crystallographic structure, microstructure, conformality, composition, and material property.

37. The method of claim 27, wherein said sacrificial layer is deposited by one or more methods selected from a group consisting of physical vapor deposition methods, chemical deposition methods, spray pyrolysis methods, electrochemical deposition methods, electroless deposition methods, and spin on methods.

38. The method of claim 27, further comprising, performing an additional etch back process for adjusting the conformality of said sacrificial layer prior to said forming a recess, said additional etch back process being performed in addition to said forming a recess in said lower level conductor.

39. The method of claim 27, further comprising, pretreating said dielectric layer prior to said depositing a sacrificial layer with one or more dielectric layer pretreatment processes selected from a group consisting of wet clean processes, degas processes, plasma clean processes, densification processes, and silylation processes.

40. The method of claim 27, wherein said etch back process is performed by using a plasma process which uses one or more gases selected from a group consisting of He, Ar, Xe, Kr, Ne, atomic hydrogen, atomic hydrogen, $H_2$, atomic nitrogen, $N_2$, nitrogen containing compound gases, CO, $CO_2$, atomic oxygen, $O_2$, $O_3$, $H_2O$, hydrocarbon gases, and a major etchant gas group consisting of halogen gases, halogen containing compound gases that do not contain a sulfur atom, non-sulfide gases containing a sulfur atom, and sulfide gases.

41. The method of claim 27, wherein said etch back process is performed by a sputter etch in a plasma of one or more inert gases selected from a group consisting of He, Ar, Xe, Kr and Ne.

42. The method of claim 27, wherein said etch back process removes materials existing over said lower level conductor at the bottom of said preliminary via hole and a portion of said lower level conductor, thereby forming said recess in said lower level conductor underneath the bottom of said preliminary via hole.

43. The method of claim 42, wherein the depth of said recess formed in said lower level conductor underneath the bottom of said preliminary via hole ranges from one atomic monolayer of said lower level conductor material to said selected thickness.

44. The method of claim 42, wherein the depth of said recess ranges from 5 percent to 50 percent of said selected thickness.

45. The method of claim 32, wherein said residue removal process is carried out by performing a wet clean process or a plasma clean process, or both.

46. The method of claim 45, wherein said wet clean process uses one or more chemicals selected from a group consisting of $B_2O_3$, $Br_2$, $CH_3COOH$, $Ce(SO_4)_2$, $Ce(SO_3)_3$, $CrO_3$, CsOH, $Cu(NO_3)_2$, $FeSO_4$, $FeCl_3$, $Fe(NO_3)_3$, $H_2O$, $H_2O_2$, $H_2N_4$, $H_2SO_4$, $H_3PO_4$, $HNO_3$, HF, $H_2S$, HCl, $HClO_4$, HI, HBr, $I_2$, KI, KOH, $KH_2PO_4$, $KMnO_4$, $KNO_3$, $K_2Fe(CN)_6$, $K_2Cr_2O_7$, $K_3Fe(CN)_6$, $K_4Fe(CN)_6$, NaOH, NaOCl, $Na_2HPO_4$, $Na_2O$, $Na_2O_2$, $NaNO_2$, $NH_3$, $NH_4F$, $NH_4OH$, $NH_2(CH_2)NH_2$, $N_2H_8C_2$, NHF, $N_2H_4$, $(NH_4)_2S_2O_4$, $O_3$, vinylacetate, dipropyleneglycolmonomethyletheracetate, ethylenediamine, ethylenedibromide, ammoniumcitrate, tetramethylammoniumhydroxide, glycerol, ethyleneglycol, oxalic acid dihydrate, anhydrous oxalic acid, citric acid, benzotriazole, propanol, pyrocatechol, polypropyleneglycol, parabenzoquinon, tartaric acid, ethanol, methanol, and isopropanol.

47. The method of claim 45, wherein said plasma clean process uses one or more gases selected from a group consisting of He, Ar, Xe, Kr, Ne, atomic hydrogen, atomic hydrogen, $H_2$, atomic nitrogen, $N_2$, nitrogen containing compound gases, CO, $CO_2$, atomic oxygen, $O_2$, $O_3$, $H_2O$, hydrocarbon gases, and a major etchant gas group consisting of halogen gases, halogen containing compound gases that do not contain a sulfur atom, non-sulfide gases containing a sulfur atom, and sulfide gases.

48. The method of claim 27, wherein said sacrificial layer is deposited on the surface of a preliminary dual damascene feature having a post etch residue remaining thereon.

49. The method of claim 27, further comprising,
a. depositing one or more conductive liner layers over said final dual damascene feature and the surface of said conductor in said recess;
b. filling said final dual damascene feature and said recess with an upper level conductor; and
c. planarizing the top surface of said upper level conductor.

50. The method of claim 49, wherein said each of said one or more conductive liner layers comprises either a conductive diffusion barrier layer or an adhesion layer, or both.

51. The method of claim 50, wherein said conductive diffusion barrier layer is deposited by a plasma enhanced chemical deposition method.

52. The method of claim 49, further comprising, performing one or more liner etch back processes prior to filling said final dual damascene feature with an upper level conductor such that the conformality of said conductive liner layers is adjusted at least one time prior to filling said final dual damascene feature with an upper level conductor.

53. The method of claim 49, wherein said filling said final dual damascene feature with an upper level conductor is performed by depositing a copper seed layer, followed by an electrochemical deposition of copper.

54. The method of claim 53, wherein said depositing a copper seed layer is performed by using one or more methods selected from a group consisting of chemical deposition methods, physical vapor deposition methods and electrochemical deposition methods.

55. The method of claim 49, wherein said upper level conductor comprises one or more conductor materials selected from a group consisting of carbon, pure metal materials, metal alloys, metal silicides, metal oxides, metal nitrides, metal carbides, metal borides, metal carbonitrides, and doped silicons.

56. The method of claim 49, wherein said planarizing the top surface of said upper level conductor is performed by a chemical mechanical polishing method.

57. The method of claim 1, wherein said etching a preliminary contact opening is performed by a wet etch process.

58. The method of claim 27, wherein said etching a preliminary dual damascene feature is performed by a wet etch process.

59. The method of claim 1, wherein the diameter of said preliminary contact opening is larger than a target contact diameter of said interconnect system.

60. The method of claim 27, wherein the diameter of said preliminary via hole and the width of said preliminary trench are larger than a target via diameter and a target width of the upper level conductor line of said dual damascene interconnect system, respectively.

61. A method for fabricating an integrated circuit device, comprising:
(a) depositing a sacrificial layer over the surface of a sidewall of a preliminary damascene feature comprising at least a preliminary contact hole, said preliminary damascene feature being formed in a dielectric layer deposited over a substrate, said substrate having a conductor formed therein;
(b) forming a recess in said conductor at the bottom of said preliminary contact hole; said sacrificial layer protecting said preliminary damascene feature from damage or contamination caused by said forming a recess in said conductor, said forming a recess in said conductor leaving a residue; and
(c) performing a residue removal process, said residue removal process removing at least a portion of said sacrificial layer from said preliminary damascene feature and said residue, said residue removal process forming a final damascene feature comprising at least a final contact hole.

* * * * *

UNITED STATES PATENT AND TRADEMARK OFFICE
CERTIFICATE OF CORRECTION

| | |
|---|---|
| PATENT NO. | : 8,703,605 B2 |
| APPLICATION NO. | : 12/831482 |
| DATED | : April 22, 2014 |
| INVENTOR(S) | : Byung Chun Yang |

Page 1 of 1

It is certified that error appears in the above-identified patent and that said Letters Patent is hereby corrected as shown below:

In the Claims

Column 29, line 31, "32" should be --27--

Signed and Sealed this
Nineteenth Day of August, 2014

Michelle K. Lee
*Deputy Director of the United States Patent and Trademark Office*